(12) United States Patent
Kurth et al.

(10) Patent No.: US 8,729,474 B1
(45) Date of Patent: May 20, 2014

(54) MICROBOLOMETER CONTACT SYSTEMS AND METHODS

(75) Inventors: Eric A. Kurth, Santa Barbara, CA (US);
Patrick Franklin, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 774 days.

(21) Appl. No.: 12/576,971

(22) Filed: Oct. 9, 2009

(51) Int. Cl.
*H01L 31/02* (2006.01)

(52) U.S. Cl.
USPC .................................................. 250/338.4

(58) Field of Classification Search
USPC .................................................. 250/338.4
See application file for complete search history.

(56) References Cited

U.S. PATENT DOCUMENTS

| | | | |
|---|---|---|---|
| 5,021,663 A | 6/1991 | Hornbeck | |
| 5,220,188 A | 6/1993 | Higashi et al. | |
| 5,220,189 A | 6/1993 | Higashi et al. | |
| 5,286,976 A | 2/1994 | Cole | |
| 5,293,041 A | 3/1994 | Kruse, Jr. | |
| 5,300,915 A | 4/1994 | Higashi et al. | |
| 5,420,419 A | 5/1995 | Wood | |
| 5,449,910 A | 9/1995 | Wood et al. | |
| 5,450,053 A | 9/1995 | Wood | |
| 5,534,111 A | 7/1996 | Hocker et al. | |
| 5,756,999 A | 5/1998 | Parrish | |
| 5,895,233 A | 4/1999 | Higashi et al. | |
| 5,912,464 A * | 6/1999 | Vilain et al. | 250/338.4 |
| 6,028,309 A | 2/2000 | Parrish | |
| 6,036,872 A | 3/2000 | Wood et al. | |
| 6,441,374 B1 * | 8/2002 | Kawano et al. | 250/338.1 |
| 6,812,465 B2 | 11/2004 | Parrish | |
| 7,034,301 B2 | 4/2006 | Parrish et al. | |
| 7,679,048 B1 | 3/2010 | Aziz et al. | |
| 2007/0170363 A1 * | 7/2007 | Schimert et al. | 250/353 |

* cited by examiner

*Primary Examiner* — David Porta
*Assistant Examiner* — Shun Lee
(74) *Attorney, Agent, or Firm* — Haynes and Boone, LLP

(57) ABSTRACT

Systems and methods are directed to contacts for an infrared detector. For example, an infrared imaging device includes a substrate having a first metal layer and an infrared detector array coupled to the substrate via a plurality of contacts. Each contact includes for an embodiment a second metal layer formed on the first metal layer; a third metal layer formed on the second metal layer, wherein the third metal layer at least partially fills an inner portion of the contact; and a first passivation layer formed on the third metal layer.

25 Claims, 23 Drawing Sheets

Coat with PR, expose and develop

Deposit metal, lift-off, remove PR

Coat with Polyimide

Coat with PR, expose and develop

No RET patterned

Coat with PR, expose and develop

Coat with PR, expose and develop

No LNR patterned

Coat with Si₃N₄

Etch* (RIE), remove PR

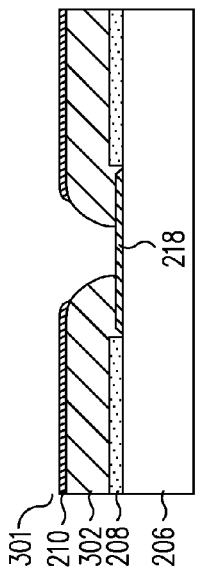
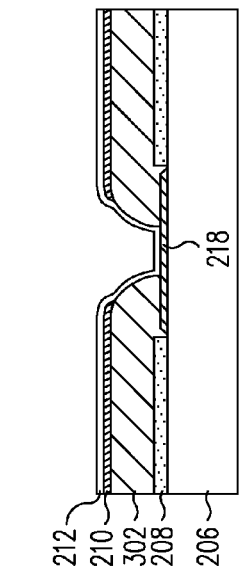
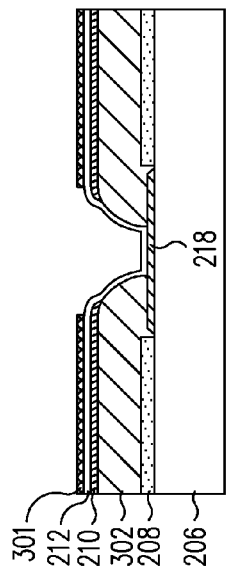
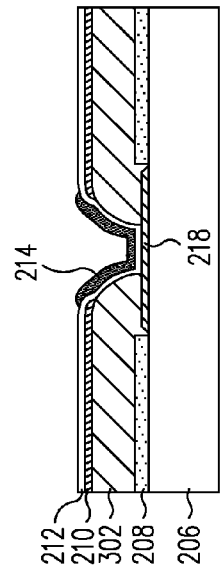
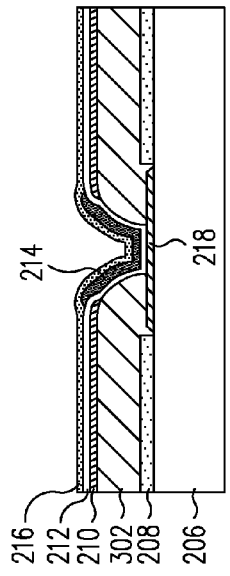

Released Contact Structure

Coat with PR, expose and develop

Etch (RIE), Ion Mill, remove PR

MICROBOLOMETER CONTACT SYSTEMS AND METHODS

TECHNICAL FIELD

One or more embodiments of the invention relate generally to infrared cameras and, more particularly, to microbolometer contact systems and methods, such as for microbolometer focal plane arrays.

BACKGROUND

A microbolometer is an example of a type of infrared detector that may be used within an infrared imaging device (e.g., an infrared camera). For example, the microbolometer is typically fabricated on a monolithic silicon substrate to form an infrared (image) detector array, with each microbolometer of the infrared detector array functioning as a pixel to produce a two-dimensional image. The change in resistance of each microbolometer is translated into a time-multiplexed electrical signal by circuitry known as the read out integrated circuit (ROIC). The combination of the ROIC and the infrared detector array (e.g., microbolometer array) is commonly known as a focal plane array (FPA) or infrared FPA (IRFPA). Additional details regarding FPAs and microbolometers may be found, for example, in U.S. Pat. Nos. 5,756,999, 6,028,309, 6,812,465, and 7,034,301, which are herein incorporated by reference in their entirety.

Each microbolometer in the array is generally formed with two separate contacts, which may or may not be shared with adjacent microbolometers in the array. One contact is used to provide a reference voltage for the microbolometer while the other contact provides a signal path from the microbolometer to the ROIC. A drawback of a conventional contact is that it is too large and/or does not scale proportionally as semiconductor processing technologies transition to smaller dimensions. Consequently, as microbolometer dimensions are reduced, the conventional contact may consume a greater percentage of the area designated for the microbolometer, which reduces the area available for the desired resistive portion of the microbolometer and impacts microbolometer performance. As a result, there is a need for improved techniques for implementing contacts, such as for microbolometer-based focal plane arrays.

SUMMARY

Systems and methods are disclosed, in accordance with one or more embodiments, which are directed to contacts for an infrared detector. For example, in accordance with an embodiment of the invention, contacts are disclosed, such as for infrared detectors within a focal plane array, that may be more area efficient as compared to conventional contacts. For one or more embodiments, the contact systems and methods disclosed herein may provide certain advantages over conventional contact approaches, especially as semiconductor processing technologies transition to smaller dimensions.

In accordance with one embodiment, an infrared imaging device includes a substrate having a first metal layer; an infrared detector array coupled to the substrate via a plurality of contacts, wherein each contact includes: a second metal layer formed on the first metal layer; a third metal layer formed on the second metal layer, wherein the third metal layer at least partially fills an inner portion of the contact; and a first passivation layer formed on the third metal layer.

In accordance with one embodiment, an infrared imaging device includes a substrate having a first metal layer; an infrared detector array coupled to the substrate via a plurality of contacts, wherein each contact includes: a metal stud formed on the first metal layer; a second metal layer formed on the metal stud; a third metal layer formed on the second metal layer, wherein the third metal layer at least partially fills an inner portion of the contact; and a first passivation layer formed on the third metal layer.

In accordance with another embodiment, a method of forming a contact on a substrate for an infrared detector array includes applying a polyimide coating on the substrate; applying a passivation layer on the polyimide coating; applying a photoresist pattern on the passivation layer; etching to expose a first metal layer on the substrate; depositing a second metal layer on the first metal layer; applying a photoresist pattern on the second metal layer; depositing a third metal layer on the second metal layer to at least partially fill an inner portion of the contact; applying a first passivation layer on the third metal layer and a portion of the second metal layer; and etching to release and provide the contact.

In accordance with another embodiment, a method of forming a contact on a substrate for an infrared detector array includes applying a polyimide coating on the substrate; applying a photoresist pattern on the polyimide coating; etching the polyimide coating to expose a first metal layer on the substrate; forming a metal stud on the first metal layer; planarizing a surface of the polyimide coating and the metal stud; applying a passivation layer on the polyimide coating and the metal stud; applying a photoresist pattern on the passivation layer; etching to expose the metal stud; depositing a second metal layer on the metal stud; depositing a third metal layer on the second metal layer; applying a first passivation layer on the third metal layer and a portion of the second metal layer; and etching to release and provide the contact.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
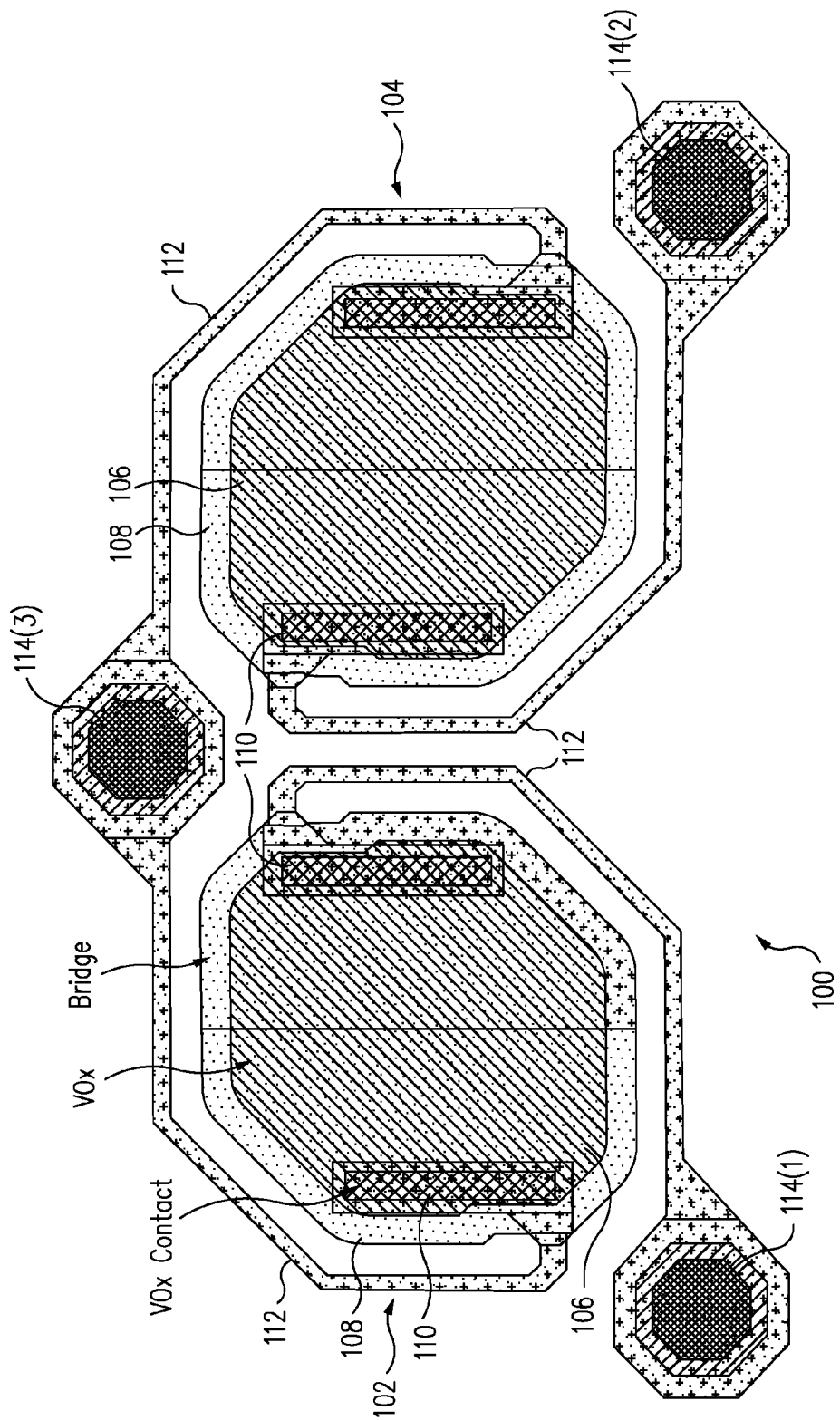
FIG. 1 shows a physical layout diagram of a microbolometer array in accordance with an embodiment of the invention.

FIG. 1 shows a physical layout diagram of a microbolometer array 100 in accordance with an embodiment of the invention. Microbolometer array 100 includes microbolometers 102 and 104, which may be viewed as being arranged as one column of two rows (e.g., where the terms rows and columns are interchangeable, i.e., alternatively viewed as being arranged as one row of two columns). However, it should be understood that microbolometer array 100 is an example of an array (or a portion of an array) having contacts in accordance with one or more embodiments.

Microbolometers 102 and 104 each include a resistive material 106, which may be formed of a high temperature coefficient of resistivity (TCR) material (e.g., vanadium oxide ($VO_x$) or amorphous silicon). Resistive material 106 is suspended on a bridge 108, with resistive material 106 coupled to its contacts 114 via legs 112. Legs 112 attach to resistive material 106 through a resistive material contact 110 (labeled $VO_x$ contact, e.g., a leg metal to resistive metal contact).

In general, microbolometers 102 and 104 may represent conventional microbolometers that are constructed in a conventional manner with conventional materials. However, contacts 114 (which are separately referenced as contacts 114(1) through 114(3)) represent novel contacts as disclosed herein in accordance with one or more embodiments.

Figure 2:
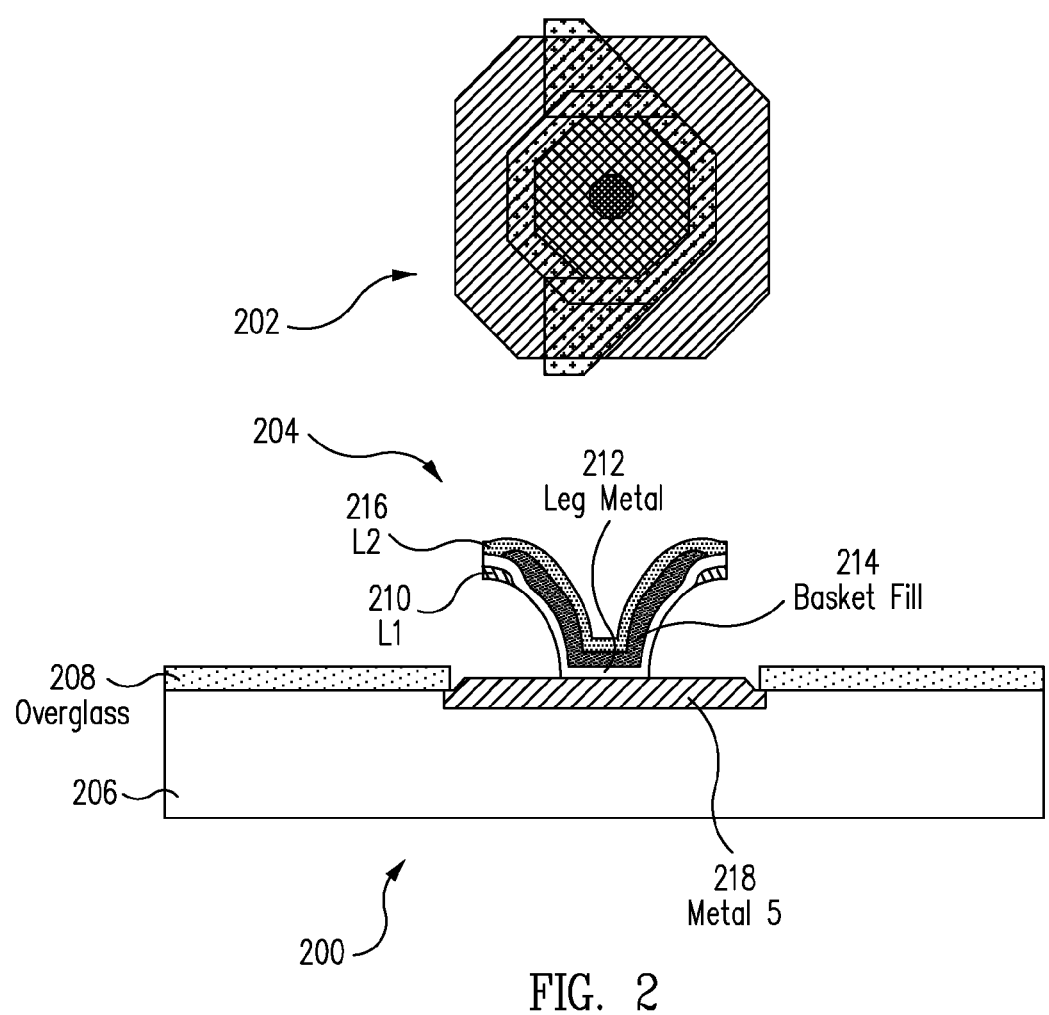
FIG. 2 shows a top view and a cross-sectional side view of a contact, such as for a contact within the microbolometer array of FIG. 1, in accordance with an embodiment of the invention.

For example, FIG. 2 shows a top view 202 and a cross-sectional side view 204 of a contact 200, which may represent an example implementation for contact 114 (e.g., contact 114(1), contact 114(2), or contact 114(3)) within the microbolometer array of FIG. 1, in accordance with an embodiment of the invention. Contact 200 may be viewed as forming a basket-shaped contact that is formed on a substrate 206 (e.g., of the ROIC) to contact a metal layer 218 (labeled Metal 5) of substrate 206 (e.g., a silicon substrate). Substrate 206 may have an overglass layer 208 formed thereon.

Contact 200 includes a leg metal layer 212 and a basket fill layer 214. Leg metal layer 212 may be made, for example, of titanium, tungsten, copper, or other known metals, while basket fill layer 214 may be made, for example, of aluminum. Contact 200 may further include a layer 216 (L2) on basket fill layer 214, with layer 216 made, for example, of silicon dioxide. Contact 200 may also further include a partial layer 210 (L1) disposed near a top portion of contact 200, but generally for an embodiment not disposed down to a base portion of contact 200 (e.g., at or near metal layer 218). Partial layer 210 may be made, for example, of silicon nitride. Layer 216 (L2) and partial layer 210 (L1) may function as passivation layers.

Contact 200 in accordance with one or more embodiments may provide certain advantages over conventional forms of contacts. For example, contact 200 does not include a liner layer (e.g., made of nickel-chromium) disposed between metal layer 218 and leg metal layer 212 to support contact 200 as would be required for some conventional approaches. As a further example, contact 200 does not require partial layer 210 (L1) to be disposed down to the base portion to metal layer 218, such as between the liner layer and leg metal layer 212 as would be required for some conventional approaches. Consequently, contact 200 may be more area efficient as semiconductor processing technologies transition to smaller dimensions and may be more easily aligned (e.g., self aligned) with metal layer 218 to form a suitable contact, such as for example for legs 112 (FIG. 1) of a corresponding microbolometer.

Figure 3A:
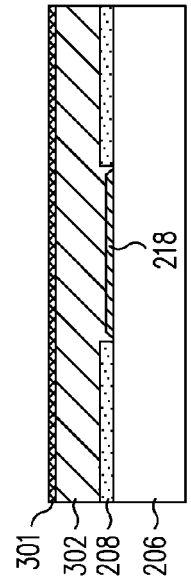
FIGS. 3A through 3R illustrate a processing overview for manufacturing a contact, such as for the contact of FIG. 2, in accordance with an embodiment of the invention.
Figure 3B:
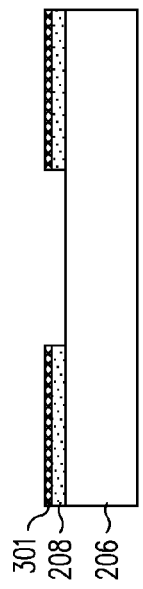
Figure 3C:
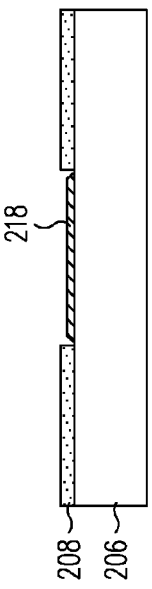
Figure 3D:
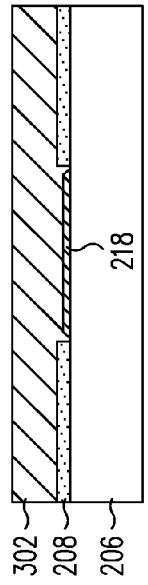
Figure 3E:
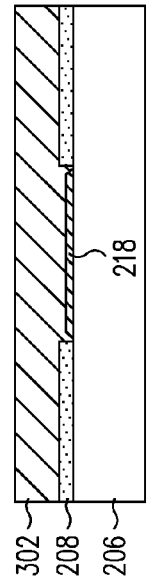
Figure 3F:
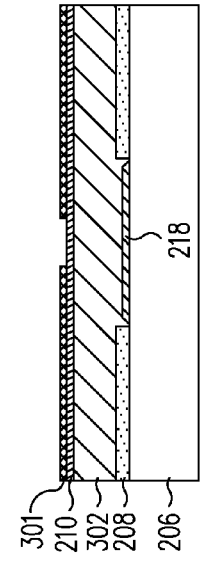
Figure 3I:
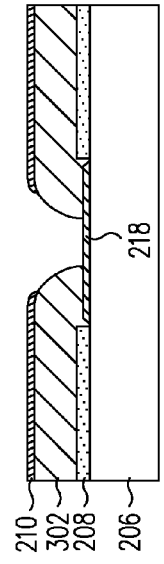
Figure 3G:
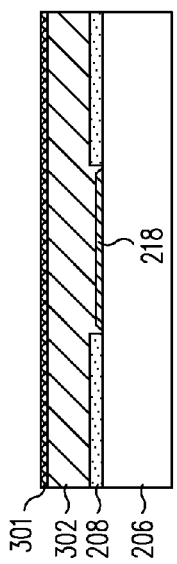
Figure 3H:
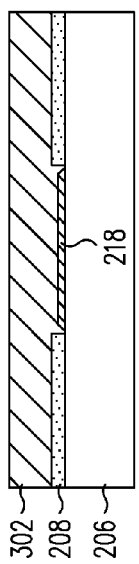
Figure 3J:
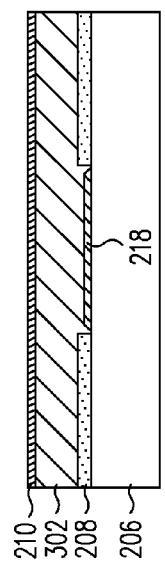
Figure 3R:
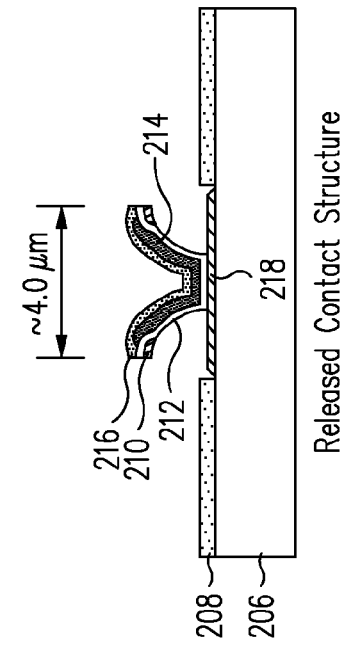

FIGS. 3A through 3R illustrate a processing overview (cross-sectional side views) for manufacturing a contact, such as contact 200 of FIG. 2, in accordance with an embodiment of the invention. Substrate 206 with overglass 208 is coated with a photoresist 301, which is exposed and developed using a mask (FIG. 3A), and metal layer 218 is deposited followed by lift-off and removal of photoresist 301 (FIG. 3B).

A polyimide coating 302 is applied (FIG. 3C). Photoresist 301 may optionally be applied, which is exposed and developed using a mask (FIG. 3D), to allow a reticulation (RET) process to optionally be performed (FIG. 3E). Photoresist 301 may again be optionally applied, which is exposed and developed using a mask (FIG. 3F), to allow a reticulation liner (LNR) process to optionally be performed (FIG. 3G). FIGS. 3D to 3G are optional process operations to allow metal layer 218 to be exposed and a metal liner to be provided as is done in some conventional processes. However, in accordance with an embodiment, these steps are optional and not required, which may provide some manufacturing advantages, as would be understood by one skilled in the art.

Partial layer 210 (L1, FIG. 2) is formed by applying a silicon nitride coating (FIG. 3H), followed by photoresist 301, which is exposed and developed using a mask (FIG. 3I), and a via process is performed (through layer 1 (L1) that forms partial layer 210) by etching and removal of photoresist 301 (FIG. 3J). For example, the etching process (e.g., reactive ion etching) may be performed using an isotropic and/or an anisotropic etch process, which may provide a narrower via (hole) above metal layer 218.

Photoresist 301 is optionally applied to areas outside of the contact area, which is exposed and developed using a mask (FIG. 3K), leg metal layer 212 is deposited, lift-off is performed (e.g., no leg metal is lifted off over the contact structure), and photoresist 301 is removed (FIG. 3L). Photoresist 301 is again applied, which is exposed and developed using a mask (FIG. 3M), basket fill layer 214 is deposited, lift-off is performed, and photoresist 301 is removed (FIG. 3N).

Figure 3P:
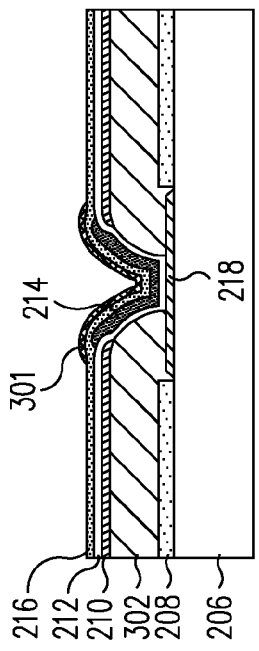
Figure 3Q:
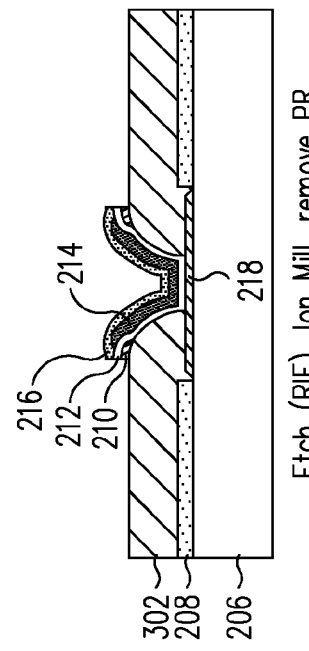

Layer 216 (L2, FIG. 2) is formed by applying a silicon dioxide coating (FIG. 3O), followed by photoresist 301, which is exposed and developed using a mask (FIG. 3P). A bridge cut leg process is performed by etching (e.g., reactive ion etching) and ion milling and photoresist 301 is removed (FIG. 3Q). Polyimide coating 302 is then removed to provide contact 200 as a released contact structure. As shown as an example in FIG. 3R, contact 200 may provide a contact width at a top portion of approximately four micrometers, which may be significantly less than conventional contact structures (e.g., six micrometers or more).

Figure 4A:
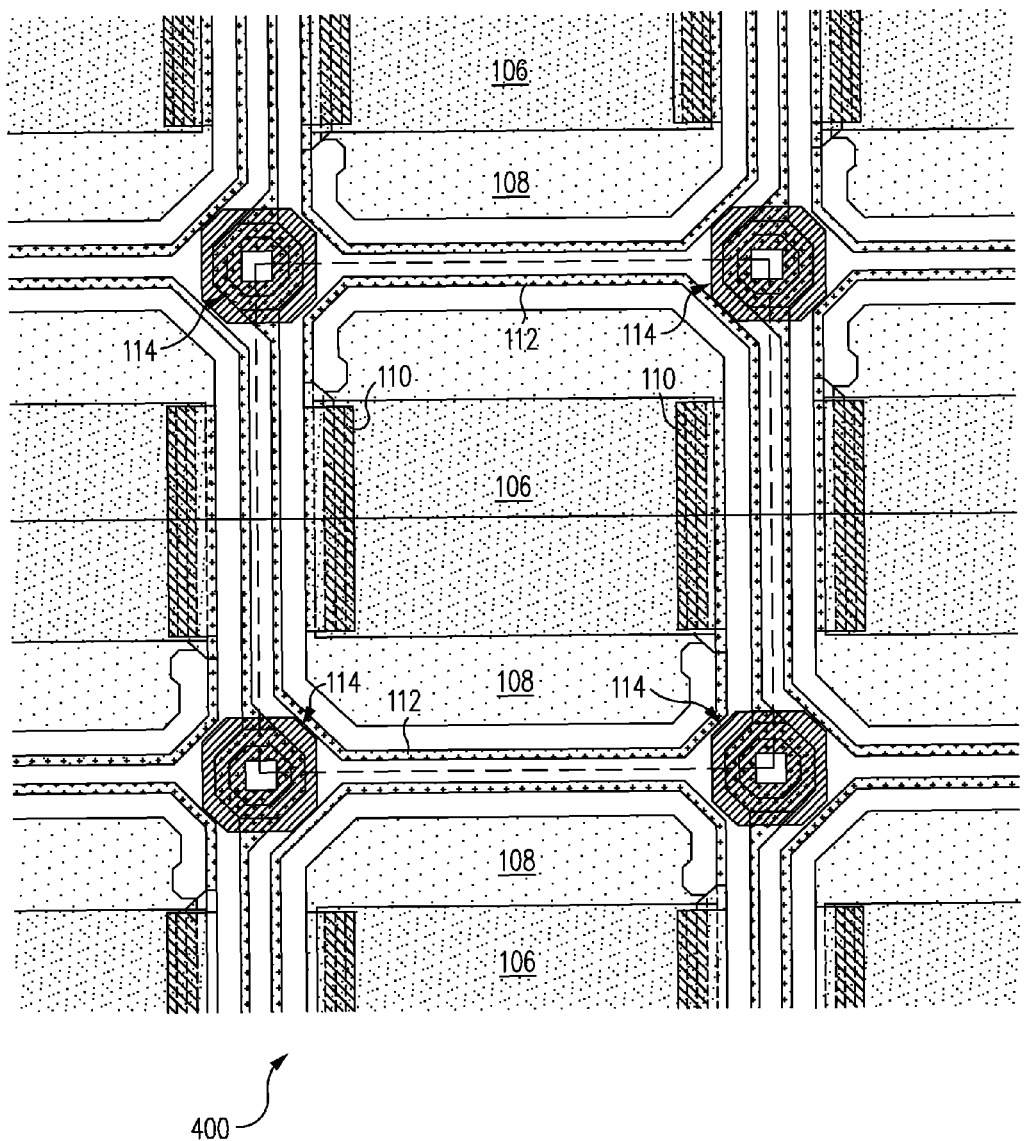
FIGS. 4A and 4B show physical layout diagrams of microbolometer arrays in accordance with one or more embodiments of the invention.
Figure 4B:
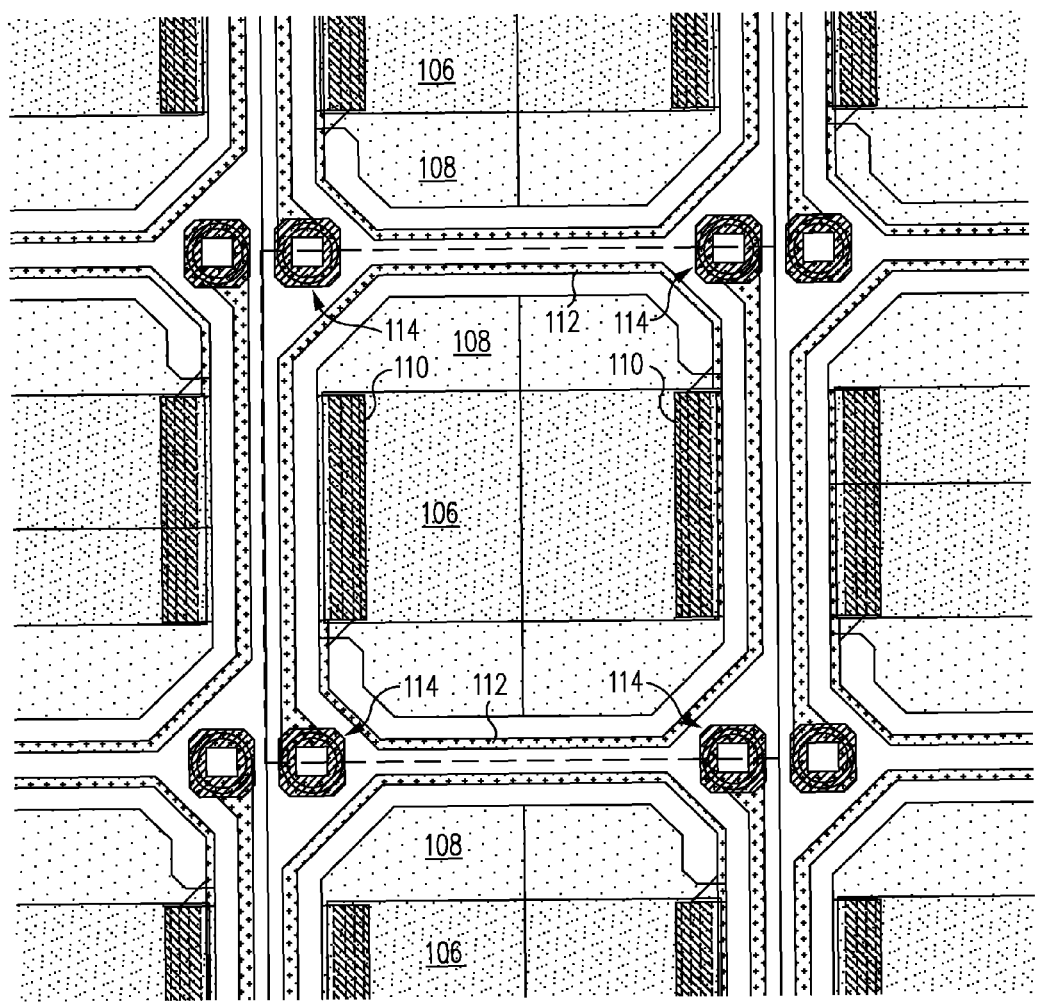

FIGS. 4A and 4B show physical layout diagrams of microbolometer arrays 400 and 450, respectively, in accordance with one or more embodiments of the invention. Microbolometer arrays 400 and 450 each illustrate a portion of an array of microbolometers (e.g., an array of any desired size) and may be viewed as being similar to microbolometer array 100 (FIG. 1).

Specifically, microbolometer array 400 includes a number of microbolometers with shared contacts (e.g., contacts 114), as shown in FIG. 4A, while microbolometer array 450 includes a number of microbolometers, with each microbolometer having two contacts (e.g., contacts 114) that are not shared with other microbolometers, as shown in FIG. 4B. As noted similarly for microbolometer array 100, microbolometer arrays 400 and 450 may represent conventional microbolometers that are constructed in a conventional manner with conventional materials. However, contacts 114 represent novel contacts as disclosed herein in accordance with one or more embodiments.

For example for microbolometer arrays 100, 400, and 450, contacts 114 may be implemented as disclosed in reference to contact 200 (FIG. 2) and may be manufactured as set forth in reference to FIGS. 3A through 3R, in accordance with one or more embodiments. Alternatively, contacts 114 within microbolometer arrays 100, 400, and 450 may be implemented as a stud contact (e.g., post/stud contact) as disclosed herein in accordance with one or more embodiments.

Figure 5:
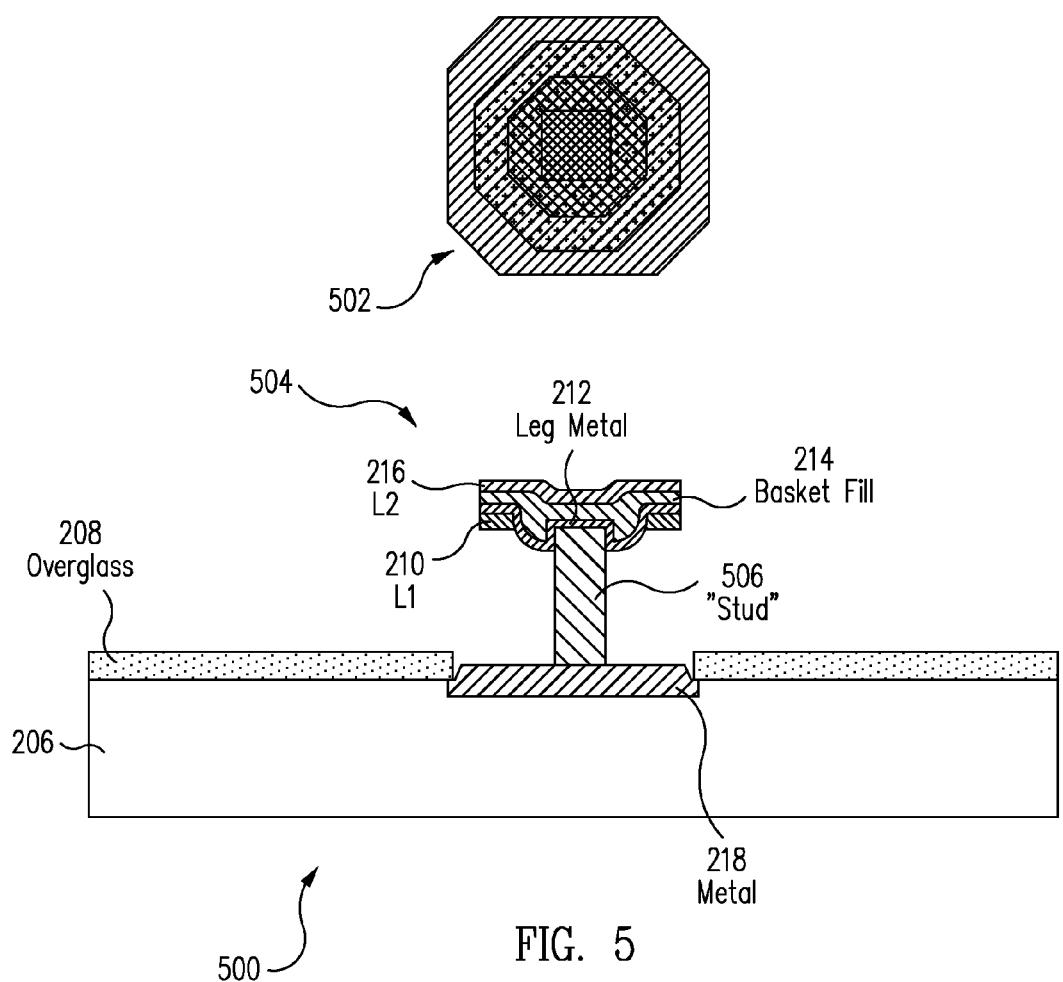
FIG. 5 shows a top view and a cross-sectional side view of a contact, such as for a contact within the microbolometer array of FIG. 1, 4A or 4B, in accordance with an embodiment of the invention.

For example, FIG. 5 shows a top view 502 and a cross-sectional side view 504 of a contact 500, which may represent an example implementation for contact 114 within the microbolometer array of FIG. 1, 4A, or 4B, in accordance with one or more embodiments of the invention. Contact 500 may be viewed as forming a stud-shaped contact (rather than a basket-shaped contact as disclosed for contact 200) that is formed on substrate 206 (e.g., of the ROIC) to contact metal layer 218 (labeled Metal 5) of substrate 206 (e.g., a silicon substrate that may have overglass layer 208 formed thereon).

As disclosed similarly for contact 200 (FIG. 2), contact 500 includes leg metal layer 212 and basket fill layer 214. Contact 500 may further include layer 216 (L2) on basket fill layer 214 and partial layer 210 (L1) disposed near a top portion of contact 200, but generally for an embodiment not disposed down along leg metal layer 212, as shown in FIG. 5. Contact 500 further includes a stud 506, which is disposed between metal layer 218 and leg metal layer 212. Stud 506 may be made of a metal, such as for example titanium, tungsten, copper, or other known metals.

Contact 500 in accordance with one or more embodiments may provide certain advantages over conventional forms of contacts. For example, contact 500 does not include a liner layer disposed between metal layer 218 and leg metal layer 212 to support contact 500 as would be required for some conventional approaches. Rather, contact 500 utilizes stud 506, which allows a very small contact structure relative to some conventional approaches. As a further example, contact 500 does not require partial layer 210 (L1) to be disposed down along leg metal layer 212, such as between the liner layer and leg metal layer 212 as would be required for some conventional approaches. Consequently, contact 500 may be more area efficient as semiconductor processing technologies transition to smaller dimensions and may be more easily aligned (e.g., self aligned) with metal layer 218 to form a suitable contact, such as for example for legs 112 (FIG. 1, 4A, or 4B) of a corresponding microbolometer.

Figure 6A:
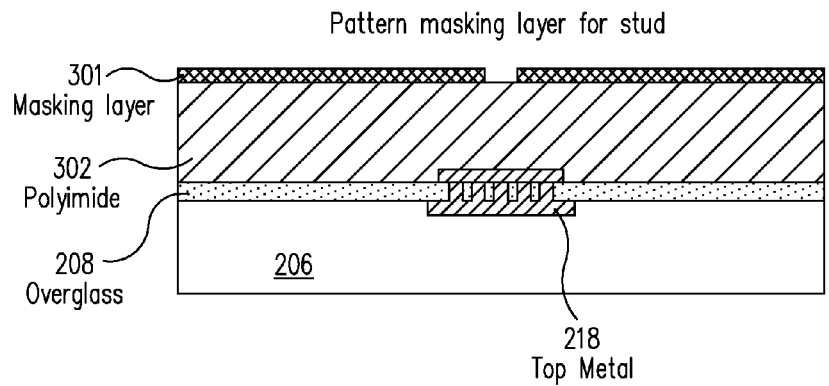
FIGS. 6A through 6Q illustrate a processing overview for manufacturing a contact, such as for the contact of FIG. 5, in accordance with one or more embodiments of the invention.
Figure 6B:
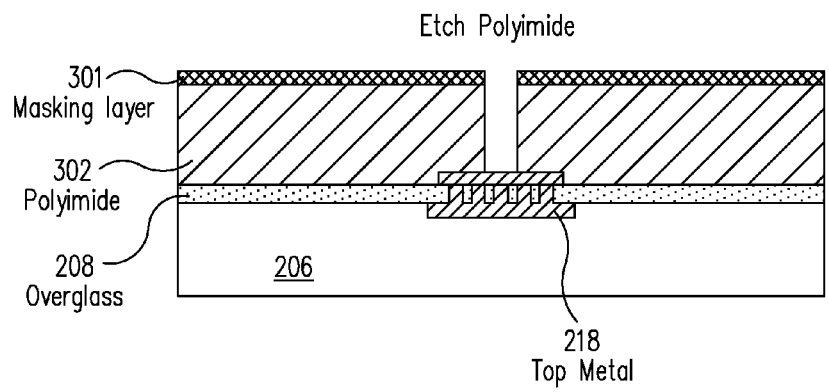
Figure 6C:
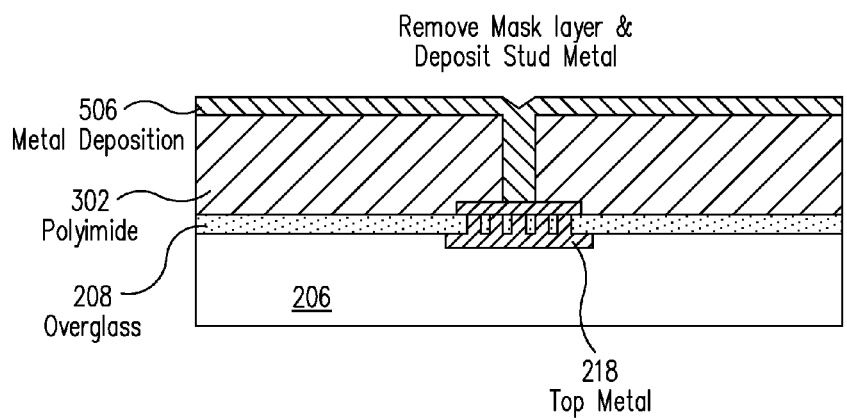
Figure 6D:
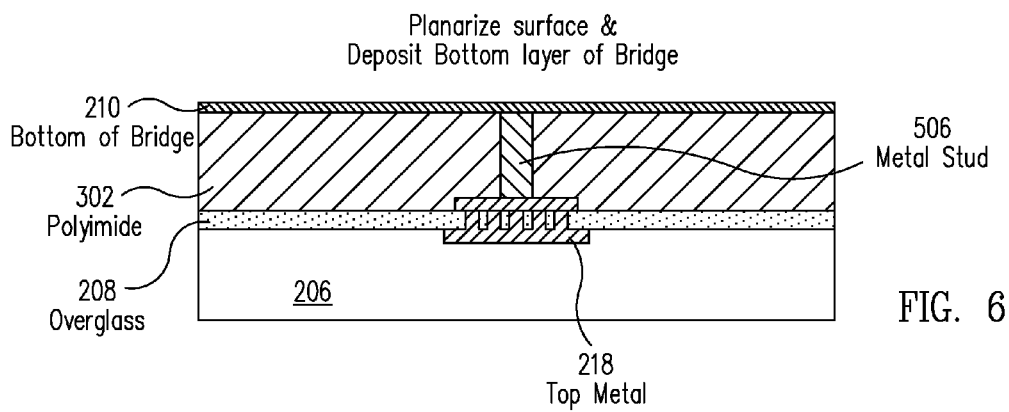

FIGS. 6A through 6I illustrate a processing overview (cross-sectional side views) for manufacturing a contact, such as contact 500 of FIG. 5, in accordance with an embodiment of the invention. As shown in FIG. 6A, substrate 206, with metal layer 218, overglass 208, and polyimide coating 302, is coated with photoresist 301 (e.g., a masking layer that has been exposed and developed to prepare to form stud 506). An etching process is performed for polyimide coating 302 (FIG. 6B), photoresist 301 is removed, and a metal deposition process is performed to form stud 506 (FIG. 6C).

Figure 6E:
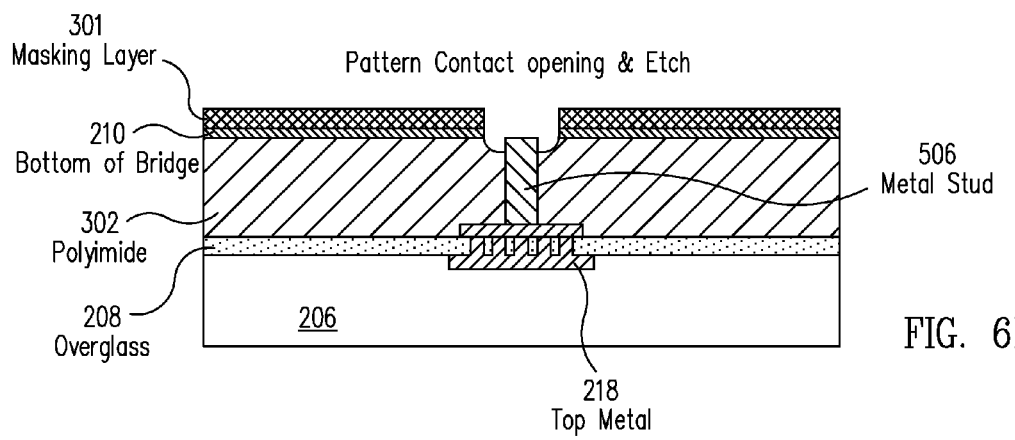
Figure 6F:
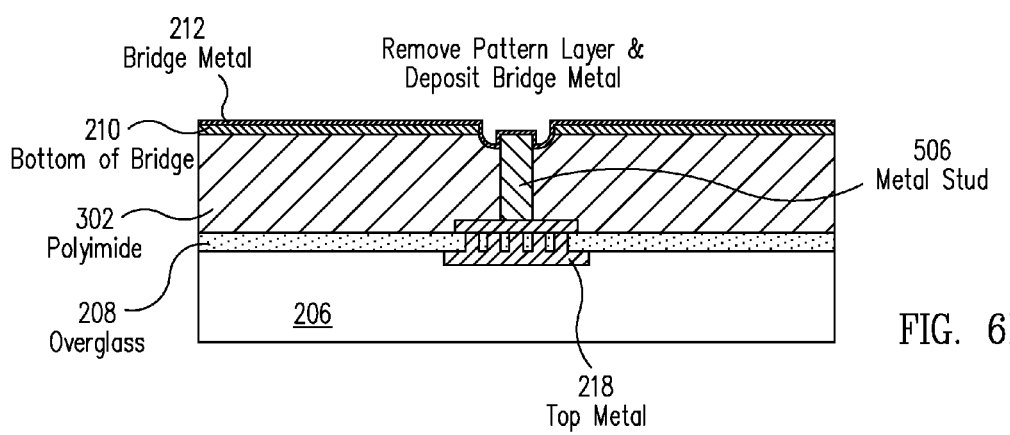

A surface planarizing process is performed and partial layer 210 (L1) is deposited (FIG. 6D), a portion of which may also serve as a bridge layer of the microbolometer (e.g., bridge 108 of FIG. 1). Photoresist 301 is applied (e.g., exposed and developed to form a masking layer) and an etching process is performed to form a contact opening (FIG. 6E).

Figure 6G:
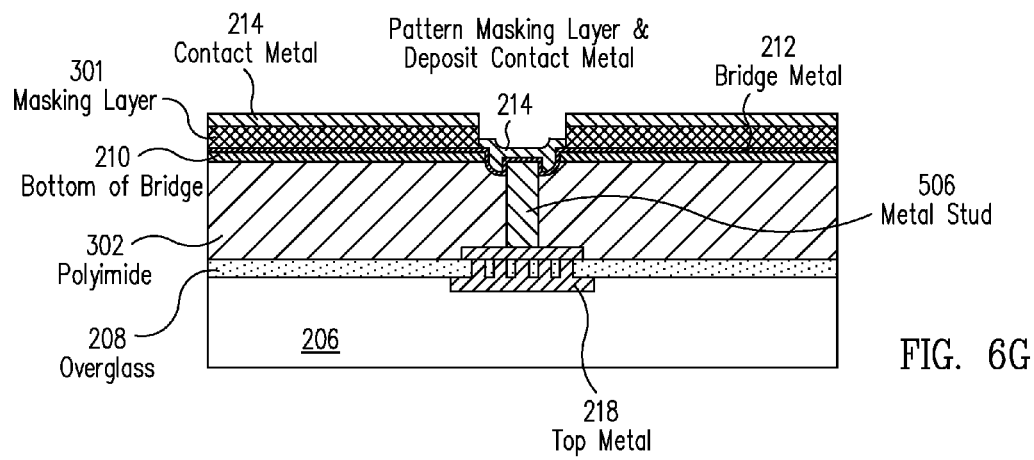
Figure 6H:
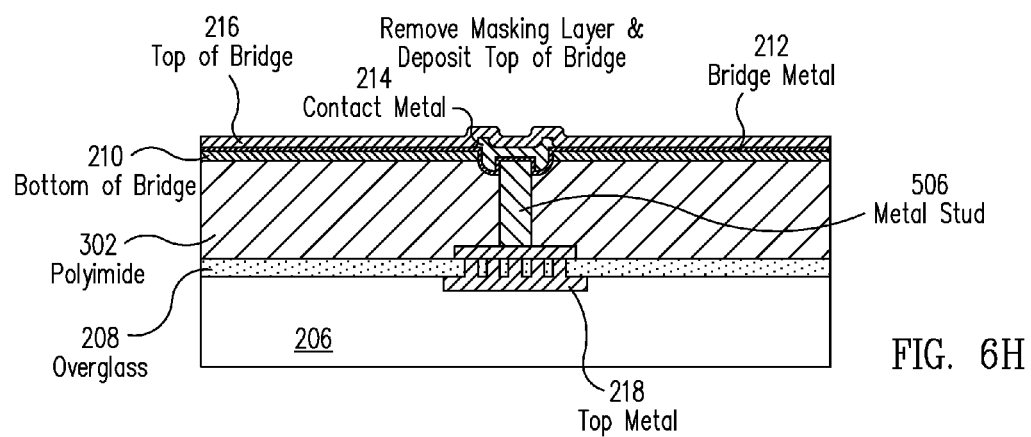
Figure 6I:
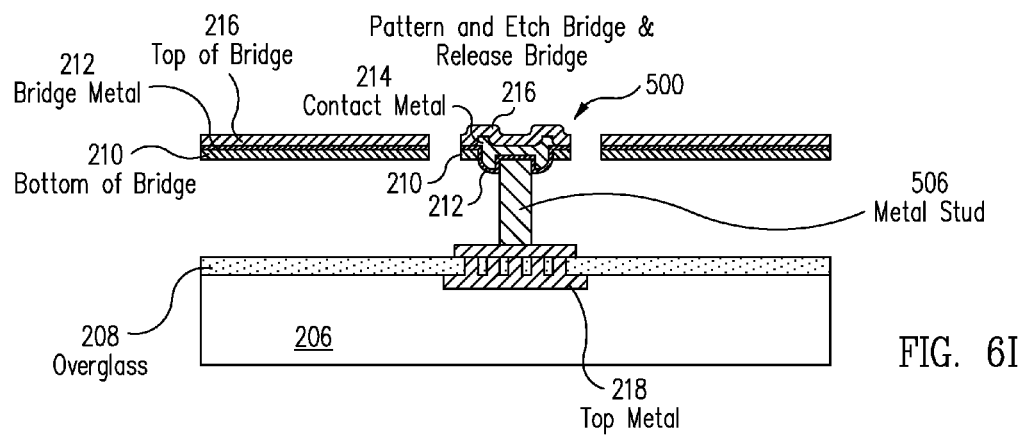
Figure 6J:
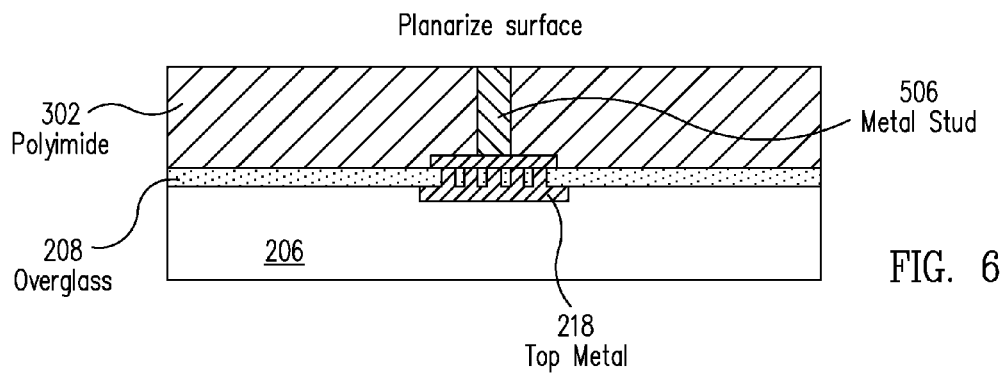

Photoresist 301 is removed and a metal deposition process is performed to form leg metal layer 212 (FIG. 6F), a portion of which may also serve as a bridge layer of the microbolometer (e.g., bridge 108 of FIG. 1). Photoresist 301 is applied (e.g., exposed and developed to form a masking layer) and a metal deposition process is performed to form basket fill layer 214 (FIG. 6G). Photoresist 301 is removed and layer 216 (L2) is deposited (FIG. 6H), a portion of which may also serve as a bridge layer (e.g., top portion) of the microbolometer (e.g., bridge 108 of FIG. 1). The bridge portion layers are separated from the contact portion layers (e.g., released by a pattern and etch process) to provide contact 500 as a released contact structure (FIG. 6I). As an example, contact 500 may provide a contact width at a top portion of approximately three micrometers, which may be significantly less than conventional contact structures (e.g., six micrometers or more).

Figure 6K:
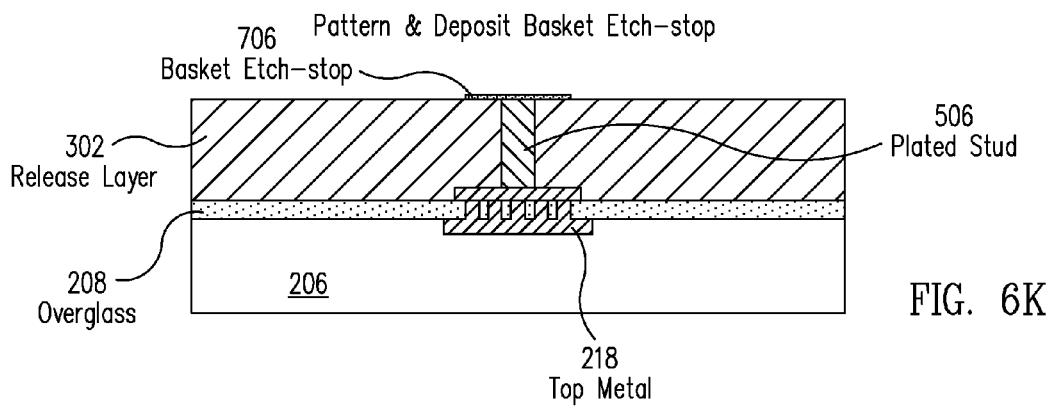
Figure 6L:
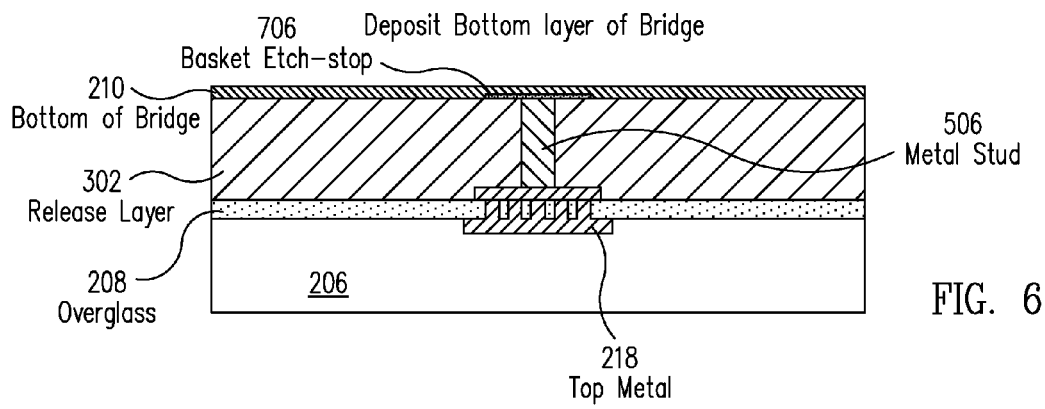

The processing overview as set forth in FIGS. 6a through 6I may be varied in accordance with one or more embodiments. For example in accordance with an embodiment, the process may include an etch-stop formed over stud 506, as illustrated in FIGS. 6J through 6Q. Specifically as an example, after stud 506 is formed (FIG. 6C), a surface planarizing process is performed (FIG. 6J) and an etch-stop 706 (e.g., a basket etch-stop) is patterned and deposited (FIG. 6K). Partial layer 210 (L1) is deposited (FIG. 6L), a portion of which may also serve as a bridge layer of the microbolometer (e.g., bridge 108 of FIG. 1).

Figure 6M:
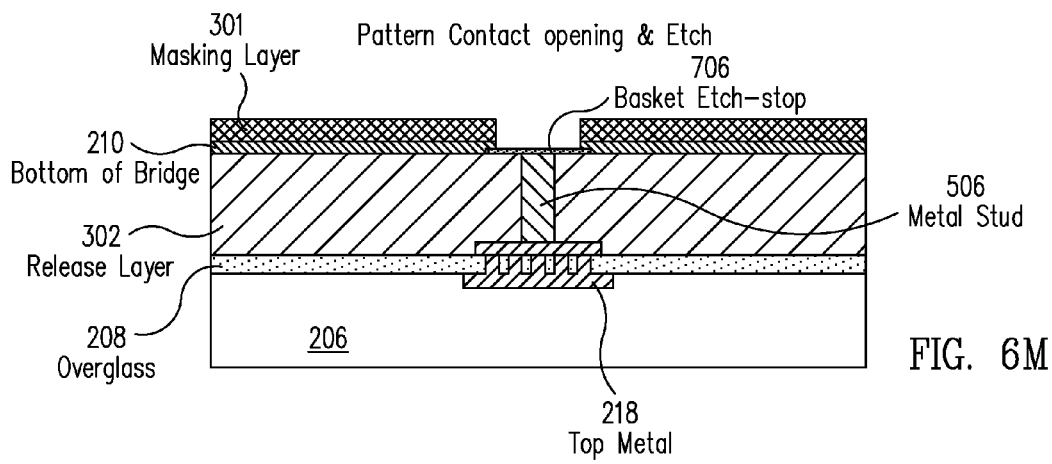
Figure 6N:
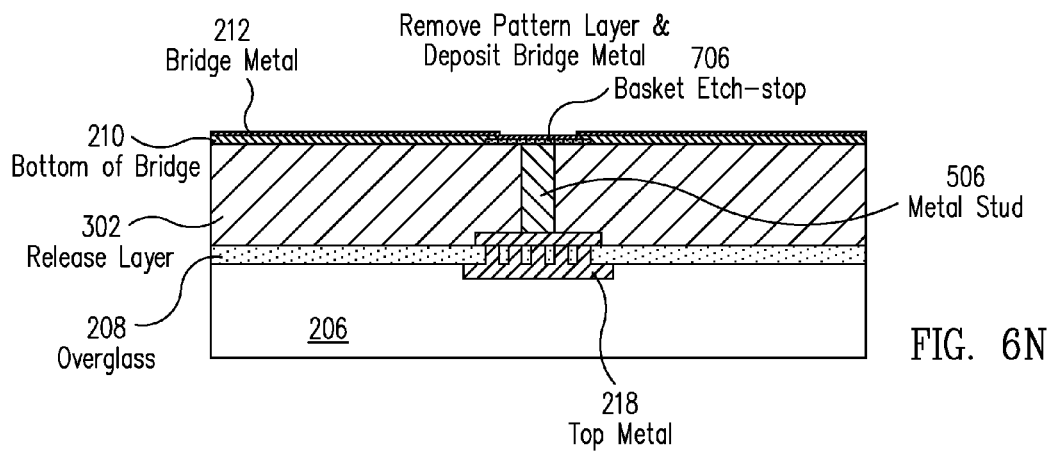

Photoresist 301 is applied (e.g., exposed and developed to form a masking layer) and an etching process is performed to form a contact opening (FIG. 6M).

Figure 6O:
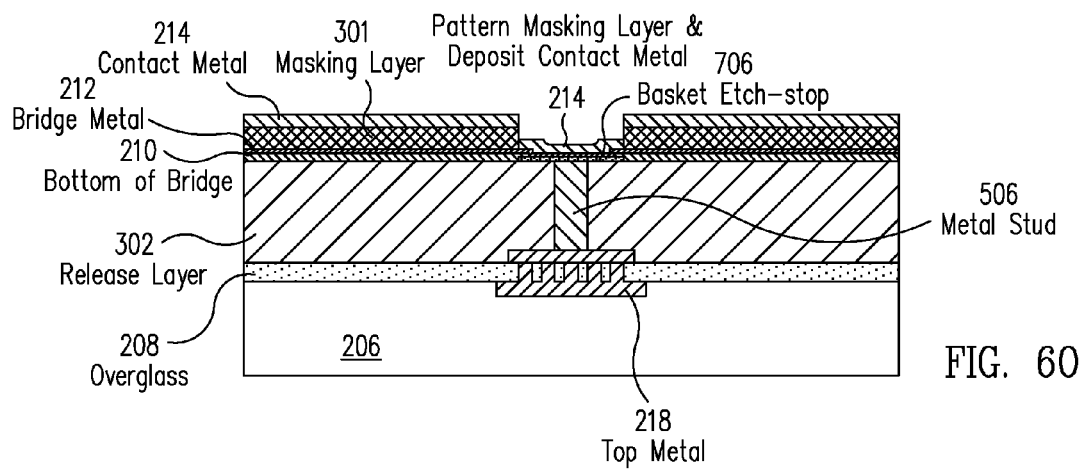
Figure 6P:
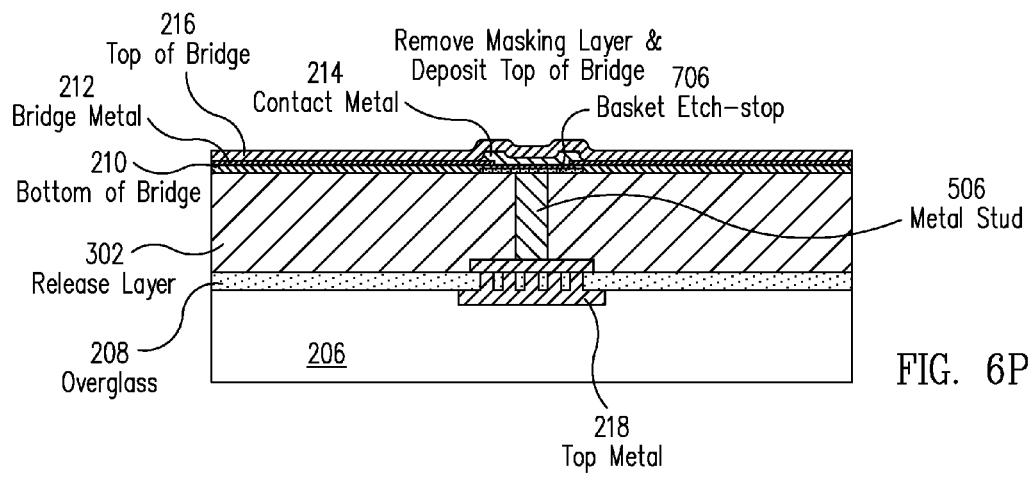
Figure 6Q:
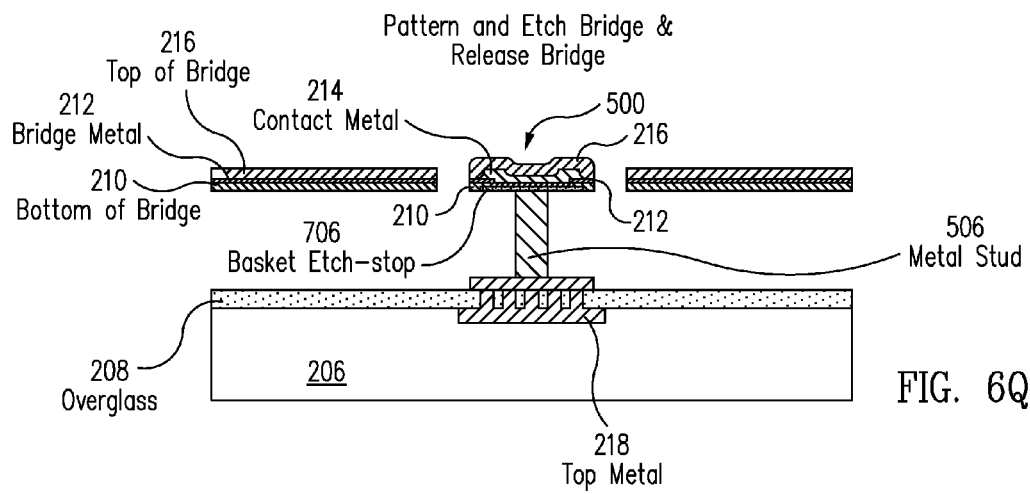

Photoresist 301 is removed and a metal deposition process is performed to form leg metal layer 212 (FIG. 6N), a portion of which may also serve as a bridge layer of the microbolometer (e.g., bridge 108 of FIG. 1). Photoresist 301 is applied (e.g., exposed and developed to form a masking layer) and a metal deposition process is performed to form basket fill layer 214 (FIG. 6O). Photoresist 301 is removed and layer 216 (L2) is deposited (FIG. 6P), a portion of which may also serve as a bridge layer (e.g., top portion) of the microbolometer (e.g., bridge 108 of FIG. 1). The bridge portion layers are separated from the contact portion layers (e.g., released by a pattern and etch process) to provide contact 500 as a released contact structure (FIG. 6Q).

FIGS. 7A through 7I illustrate an alternative processing overview for manufacturing a contact, such as contact 500 of FIG. 5, in accordance with an embodiment of the invention. In general, stud 506 of FIG. 6I is formed as disclosed by metal deposition, but may alternatively be formed by electroplating as disclosed in reference to FIGS. 7A through 7I.

Figure 7A:
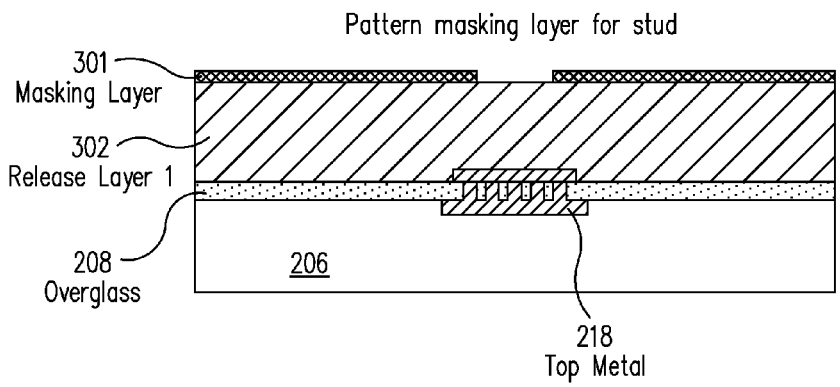
FIGS. 7A through 7P illustrate a processing overview for manufacturing a contact, such as for the contact of FIG. 5, in accordance with one or more embodiments of the invention.
Figure 7B:
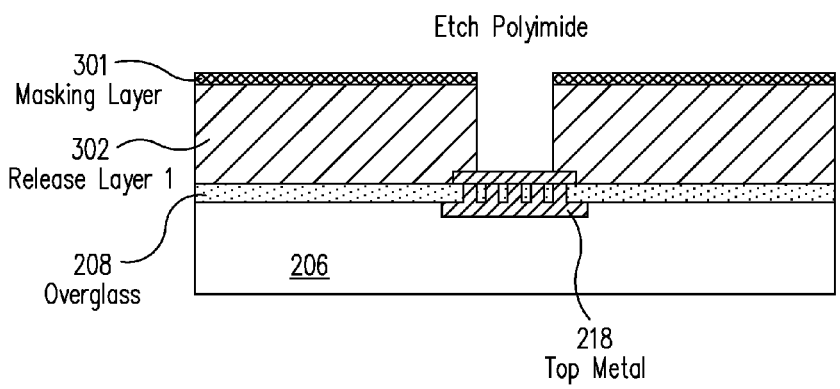
Figure 7C:
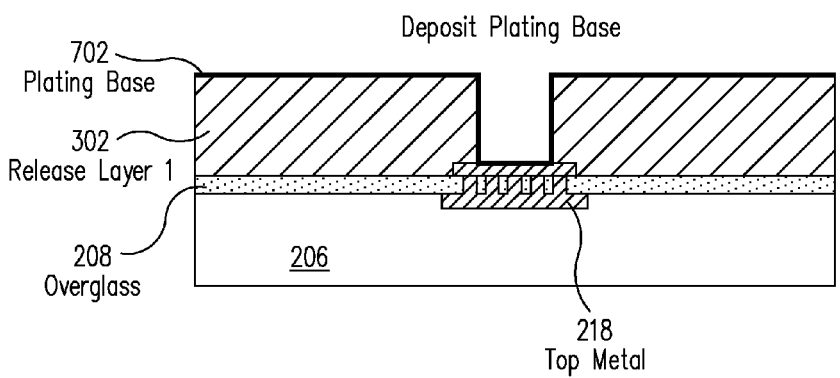

As shown in FIG. 7A, substrate 206, with metal layer 218, overglass 208, and polyimide coating 302 (e.g., release layer 1), is coated with photoresist 301 (e.g., a masking layer that has been exposed and developed to prepare to form stud 506). An etching process is performed for polyimide coating 302 (FIG. 7B), photoresist 301 is removed, and a metal plating base layer 702 is deposited (FIG. 7C). The metal plating base layer may be made, for example, of nickel chrome.

Figure 7D:
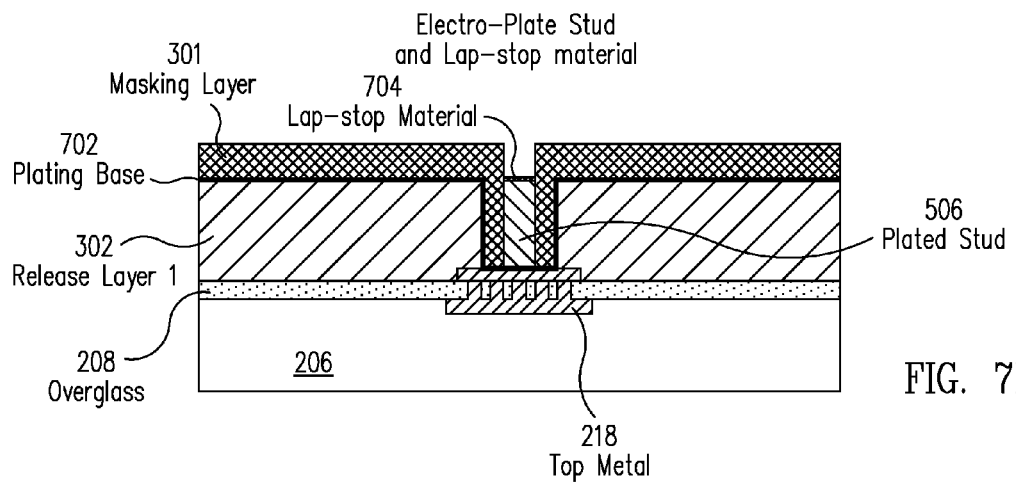
Figure 7E:
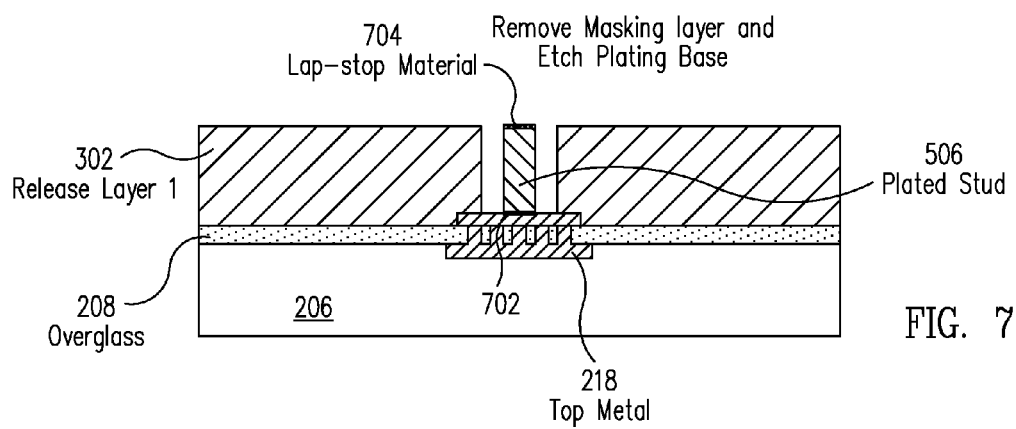
Figure 7F:
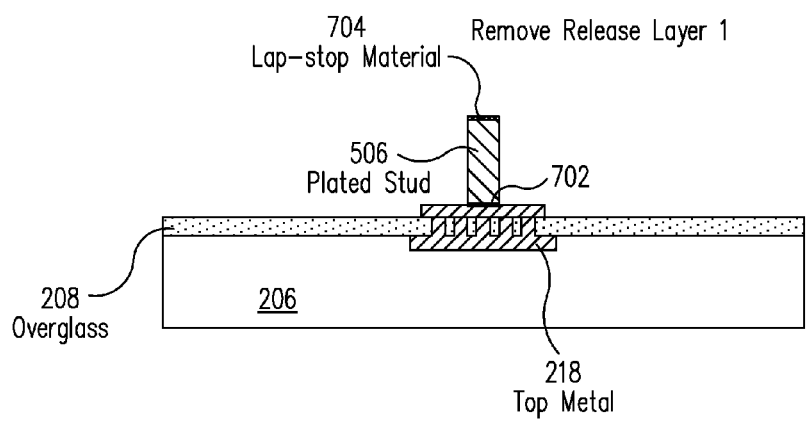

Photoresist 301 is applied and stud 506 is formed by an electroplating process (FIG. 7D, plated stud). A lap-stop material 704 may optionally be applied over stud 506, as shown in FIG. 7D. Photoresist 301 is removed, metal plating base layer 702 is removed by etching, except for the portion under stud 506 (FIG. 7E), and polyimide coating 302 is removed (FIG. 7F).

Figure 7G:
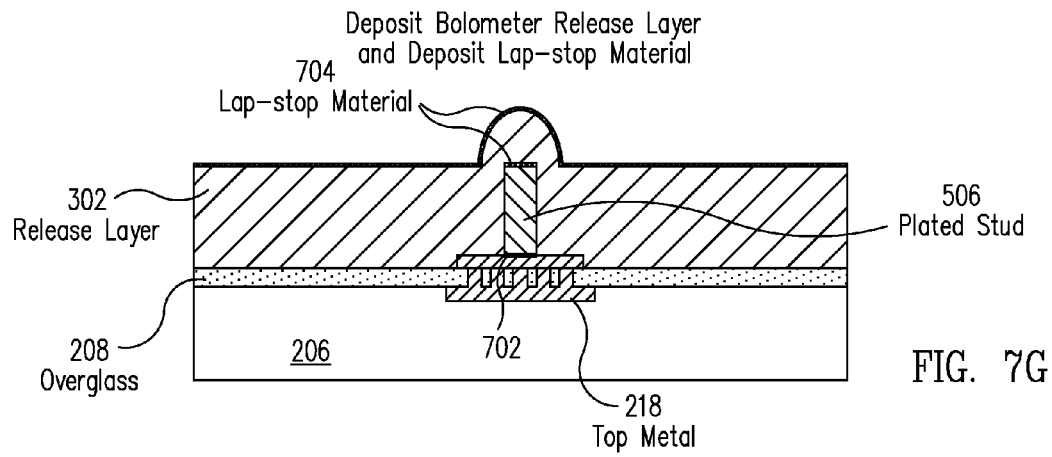
Figure 7H:
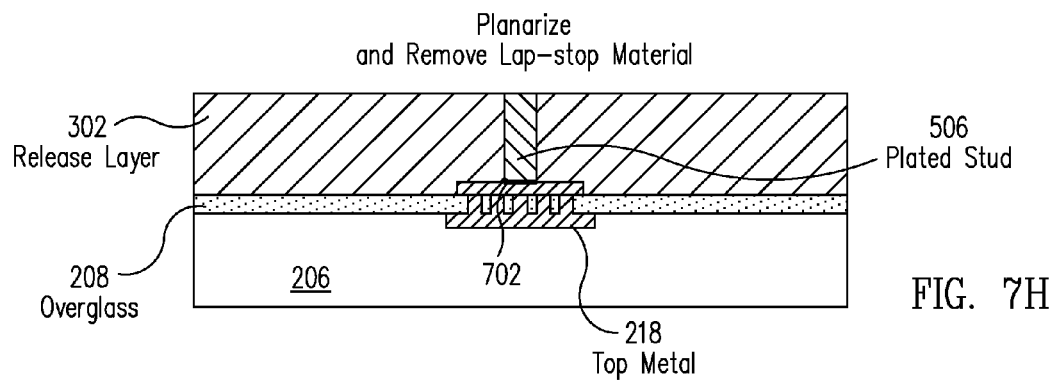
Figure 7I:
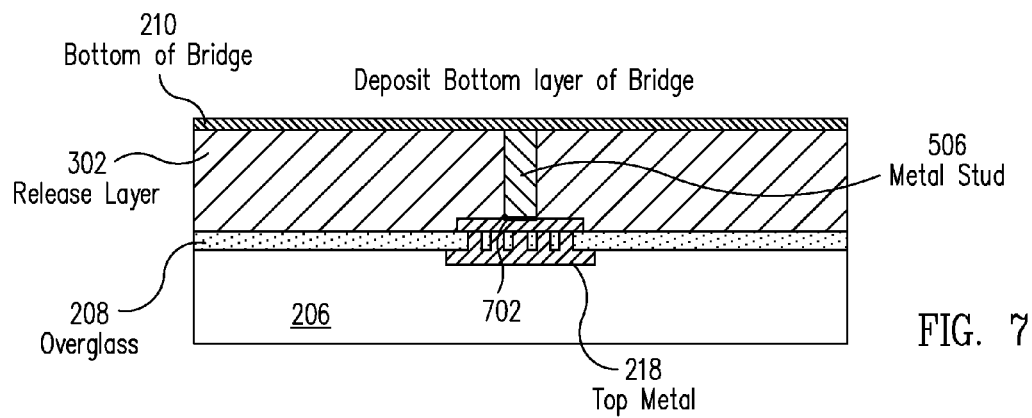

Polyimide coating 302 (e.g., release layer 2 or microbolometer release layer) is applied along with lap-stop material 704, as shown in FIG. 7G. A surface planarization process is performed and lap-stop material 704 is removed (FIG. 7H). Partial layer 210 (L1) is deposited (FIG. 7I), a portion of which may also serve as a bridge layer of the microbolometer (e.g., bridge 108 of FIG. 1). The process may then proceed as discussed in reference to FIGS. 6E to 6I to form contact 500, but having stud 506 plated as disclosed and as would be understood by one skilled in the art.

Figure 7J:
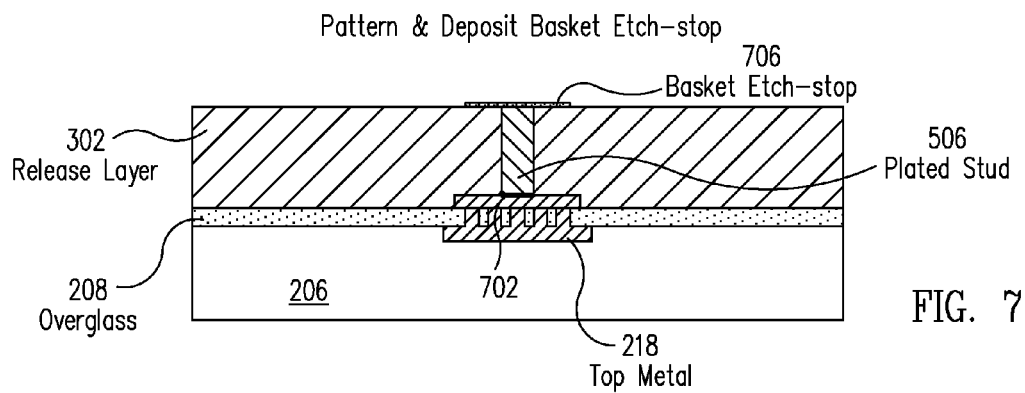
Figure 7K:
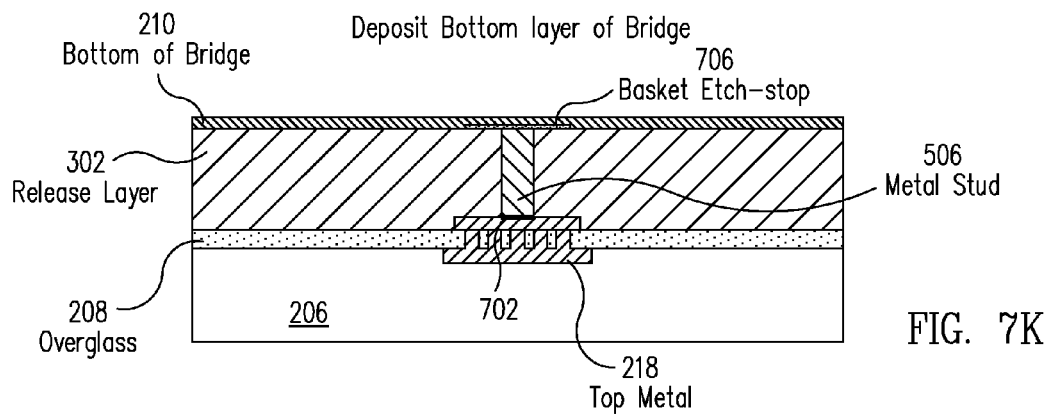
Figure 7L:
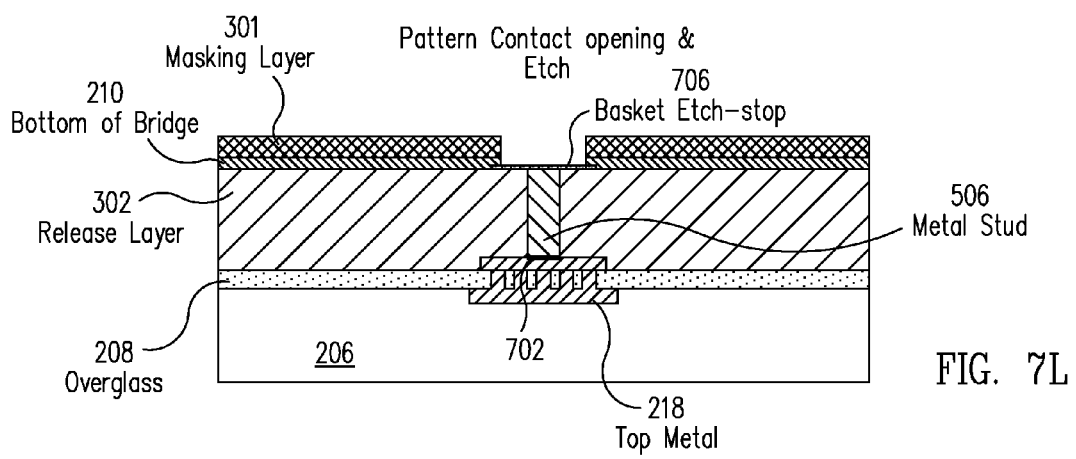
Figure 7M:
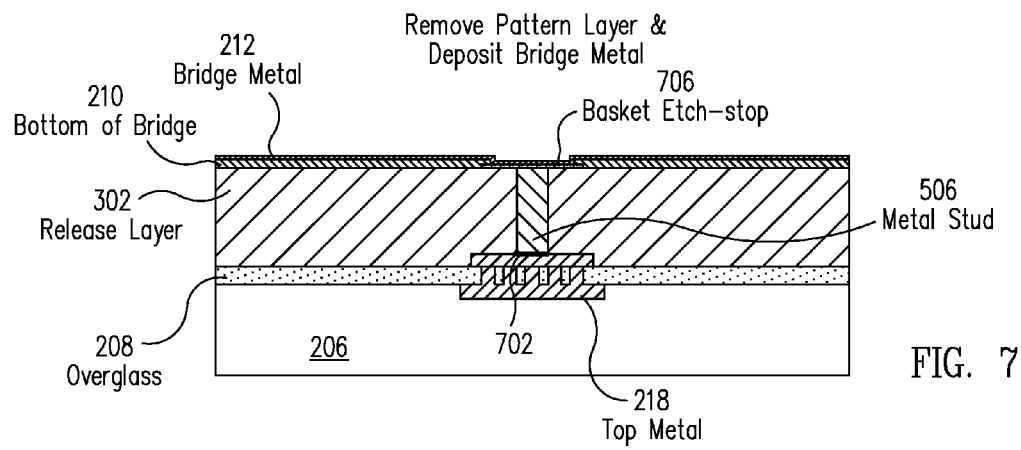
Figure 7N:
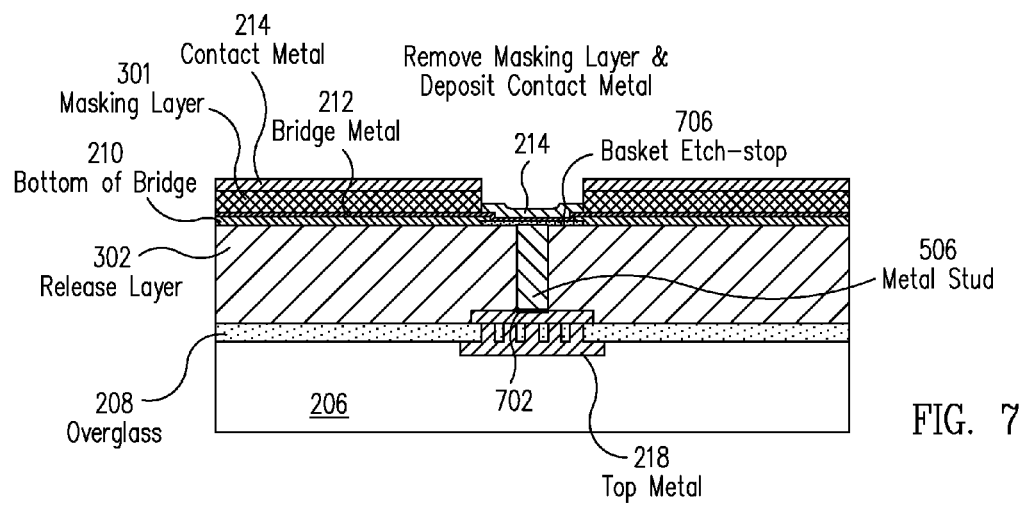
Figure 7O:
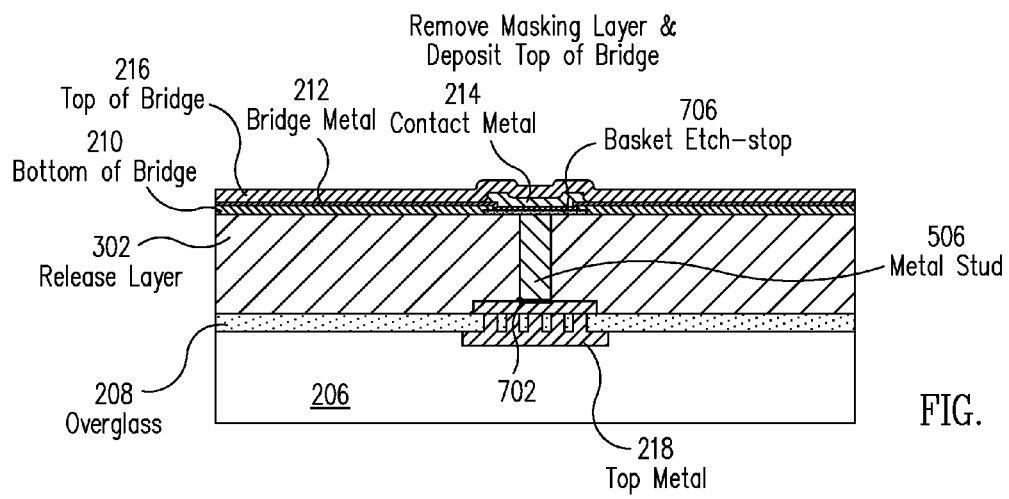
Figure 7P:
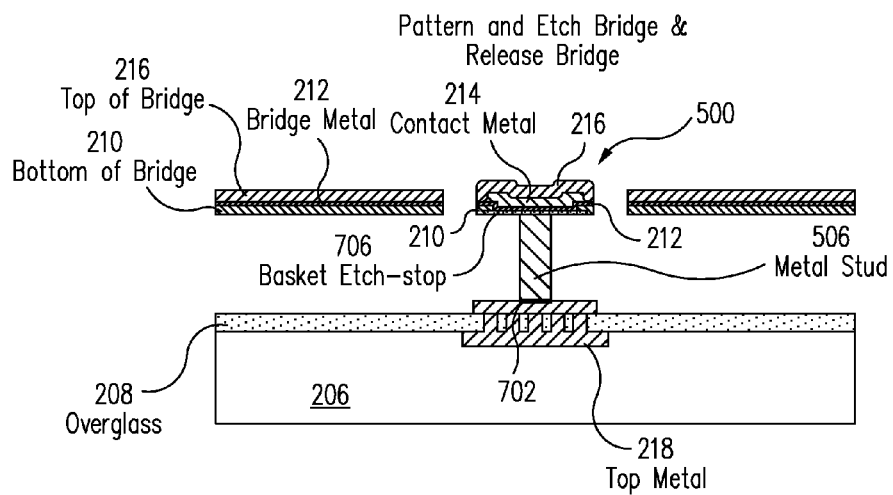

The processing overview as set forth in FIGS. 7a through 7I may be varied in accordance with one or more embodiments. For example in accordance with an embodiment, the process may include an etch-stop formed over stud 506, as illustrated in FIGS. 7J through 7P. Specifically as an example, after stud 506 is formed, the surface planarization process is performed, and lap-stop material 704 is removed (FIG. 7H), an etch-stop 706 (e.g., a basket etch-stop) is patterned and deposited (FIG. 7J). Partial layer 210 (L1) is deposited (FIG. 7K), a portion of which may also serve as a bridge layer of the microbolometer (e.g., bridge 108 of FIG. 1). The process may then proceed as shown in FIGS. 7L through 7P in a similar fashion as discussed in reference to FIGS. 6E to 6I to form contact 500, but having stud 506 plated and having etch-stop 706 as disclosed and as would be understood by one skilled in the art.

Figure 8:
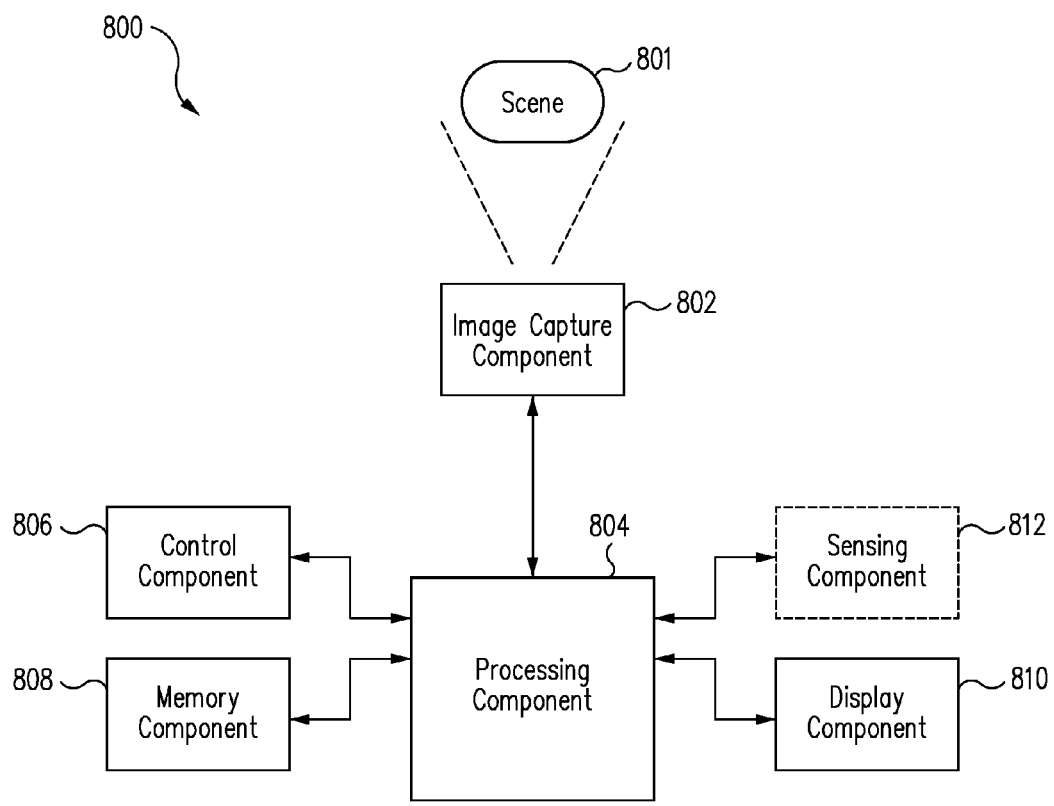
FIG. 8 shows a block diagram illustrating an infrared camera in accordance with one or more embodiments.

Systems and methods are disclosed herein to provide contacts for an infrared detector, in accordance with one or more embodiments. For example, in accordance with an embodiment, contacts are disclosed, such as for infrared detectors within a focal plane array. As an implementation example, FIG. 8 shows a block diagram illustrating a system 800 (e.g., an infrared camera, including any type of infrared imaging system) for capturing images and processing in accordance with one or more embodiments. System 800 comprises, in one implementation, an image capture component 802, a processing component 804, a control component 806, a memory component 808, and a display component 810. Optionally, system 800 may include a sensing component 812.

System 800 may represent, for example, an infrared imaging device, such as an infrared camera, to capture and process images, such as video images of a scene 801. The system 800 may represent any type of infrared camera that employs infrared detectors having contacts, which may be implemented as disclosed herein. System 800 may comprise a portable device and may be incorporated, e.g., into a vehicle (e.g., an automobile or other type of land-based vehicle, an aircraft, or a spacecraft) or a non-mobile installation requiring infrared images to be stored and/or displayed or may comprise a distributed networked system (e.g., processing component 804 distant from and controlling image capture component 802 via the network).

In various embodiments, processing component 804 may comprise any type of a processor or a logic device (e.g., a programmable logic device (PLD) configured to perform processing functions). Processing component 804 may be adapted to interface and communicate with components 802, 806, 808, and 810 to perform method and processing steps and/or operations, such as for example, controlling biasing and other functions (e.g., values for elements such as variable resistors and current sources, switch settings for biasing and timing, and other parameters) along with other conventional system processing functions as would be understood by one skilled in the art.

Memory component 808 comprises, in one embodiment, one or more memory devices adapted to store data and information, including for example infrared data and information. Memory device 808 may comprise one or more various types of memory devices including volatile and non-volatile memory devices, including computer-readable medium (portable or fixed). Processing component 804 may be adapted to execute software stored in memory component 808 so as to perform method and process steps and/or operations described herein.

Image capture component 802 comprises, in one embodiment, one or more infrared sensors (e.g., any type of multi-pixel infrared detector, such as a focal plane array having one or more contacts as disclosed herein) for capturing infrared image data (e.g., still image data and/or video data) representative of an image, such as scene 801. In one implementation, the infrared sensors of image capture component 802 provide for representing (e.g., converting) the captured image data as digital data (e.g., via an analog-to-digital converter included as part of the infrared sensor or separate from the infrared sensor as part of system 800). In one or more embodiments, image capture component 802 may further represent or include a lens, a shutter, and/or other associated components along with the vacuum package assembly for capturing infrared image data. Image capture component 802 may further include temperature sensors (or temperature sensors may be distributed within system 800) to provide temperature information to processing component 804 as to operating temperature of image capture component 802.

In one aspect, the infrared image data (e.g., infrared video data) may comprise non-uniform data (e.g., real image data) of an image, such as scene 801. Processing component 804 may be adapted to process the infrared image data (e.g., to provide processed image data), store the infrared image data in memory component 808, and/or retrieve stored infrared image data from memory component 808. For example, processing component 804 may be adapted to process infrared image data stored in memory component 808 to provide processed image data and information (e.g., captured and/or processed infrared image data).

Control component 806 comprises, in one embodiment, a user input and/or interface device, such as a rotatable knob (e.g., potentiometer), push buttons, slide bar, keyboard, etc., that is adapted to generate a user input control signal. Processing component 804 may be adapted to sense control input signals from a user via control component 806 and respond to any sensed control input signals received therefrom. Processing component 804 may be adapted to interpret such a control input signal as a parameter value, as generally understood by one skilled in the art. In one embodiment, control component 806 may comprise a control unit (e.g., a wired or wireless handheld control unit) having push buttons adapted to interface with a user and receive user input control values. In one implementation, the push buttons of the control unit may be used to control various functions of the system 800, such as autofocus, menu enable and selection, field of view, brightness, contrast, noise filtering, high pass filtering, low pass filtering, and/or various other features as understood by one skilled in the art.

Display component 810 comprises, in one embodiment, an image display device (e.g., a liquid crystal display (LCD) or various other types of generally known video displays or monitors). Processing component 804 may be adapted to display image data and information on the display component 810. Processing component 804 may be adapted to retrieve image data and information from memory component 808 and display any retrieved image data and information on display component 810. Display component 810 may comprise display electronics, which may be utilized by processing component 804 to display image data and information (e.g., infrared images). Display component 810 may be adapted to receive image data and information directly from image capture component 802 via the processing component 804, or the image data and information may be transferred from memory component 808 via processing component 804.

Optional sensing component 812 comprises, in one embodiment, one or more sensors of various types, depending on the application or implementation requirements, as would be understood by one skilled in the art. The sensors of optional sensing component 812 provide data and/or information to at least processing component 804. In one aspect, processing component 804 may be adapted to communicate with sensing component 812 (e.g., by receiving sensor information from sensing component 812) and with image capture component 802 (e.g., by receiving data and information from image capture component 802 and providing and/or receiving command, control, and/or other information to and/or from one or more other components of system 800).

In various implementations, sensing component 812 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 812 may represent conventional sensors as generally known by one skilled in the art for monitoring various conditions (e.g., environmental conditions) that may have an effect (e.g., on the image appearance) on the data provided by image capture component 802.

In some implementations, optional sensing component 812 (e.g., one or more of sensors) may comprise devices that relay information to processing component 804 via wired and/or wireless communication. For example, optional sensing component 812 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 800 may be combined and/or implemented or not, as desired or depending on the application or requirements, with system 800 representing various functional blocks of a related system. In one example, processing component 804 may be combined with memory component 808, image capture component 802, display component 810, and/or optional sensing component 812. In another example, processing component 804 may be combined with image capture component 802 with only certain functions of processing component 804 performed by circuitry (e.g., a processor, a microprocessor, a logic device, a microcontroller, etc.) within image capture component 802. Furthermore, various components of system 800 may be remote from each other (e.g., image capture component 802 may comprise a remote sensor with processing component 804, etc. representing a computer that may or may not be in communication with image capture component 802).

Figure 9:
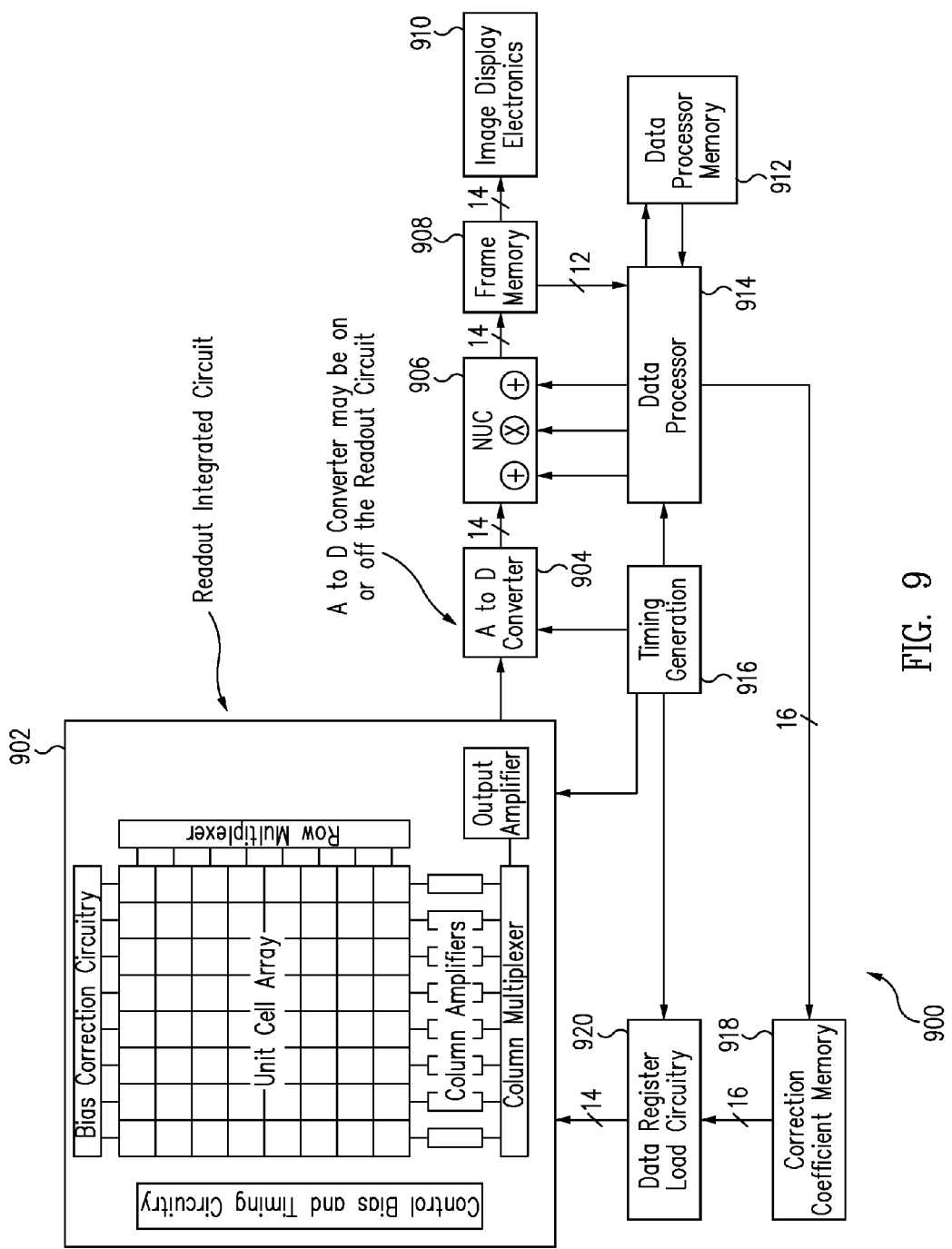
FIG. 9 shows a block diagram illustrating another implementation example for an infrared camera in accordance with one or more embodiments.

FIG. 9 shows a block diagram illustrating a specific implementation example for an infrared camera 900 in accordance with one or more embodiments. Infrared camera 900 may represent a specific implementation of system 800 (FIG. 8), as would be understood by one skilled in the art.

Infrared camera 900 (e.g., a microbolometer readout integrated circuit with bias-correction circuitry and interface system electronics) includes a readout integrated circuit (ROIC) 902, which may include the microbolometer unit cell array having one or more contacts as disclosed herein, control circuitry, timing circuitry, bias circuitry, row and column addressing circuitry, column amplifiers, and associated electronics to provide output signals that are digitized by an analog-to-digital (A/D) converter 904. The A/D converter 904 may be located as part of or separate from ROIC 902.

The output signals from A/D converter 904 are adjusted by a non-uniformity correction circuit (NUC) 906, which applies temperature dependent compensation as would be understood by one skilled in the art. After processing by NUC 906, the output signals are stored in a frame memory 908. The data in frame memory 908 is then available to image display electronics 910 and a data processor 914, which may also have a data processor memory 912. A timing generator 916 provides system timing.

Data processor 914 generates bias-correction data words, which are loaded into a correction coefficient memory 918. A data register load circuit 920 provides the interface to load the correction data into ROIC 902. In this fashion, variable circuitry such as variable resistors, digital-to-analog converters, biasing circuitry, which control voltage levels, biasing, frame timing, circuit element values, etc., are controlled by data processor 914 so that the output signals from ROIC 902 are uniform over a wide temperature range.

It should be understood that various functional blocks of infrared camera 900 may be combined and various functional blocks may also not be necessary, depending upon a specific application and specific requirements. For example, data processor 914 may perform various functions of NUC 906, while various memory blocks, such as correction coefficient memory 918 and frame memory 908, may be combined as desired.

Where applicable, various embodiments of the invention may be implemented using hardware, software, or various combinations of hardware and software. Where applicable, various hardware components and/or software components set forth herein may be combined into composite components comprising software, hardware, and/or both without departing from the scope and functionality of the invention. Where applicable, various hardware components and/or software components set forth herein may be separated into subcomponents having software, hardware, and/or both without departing from the scope and functionality of the invention. Where applicable, it is contemplated that software components may be implemented as hardware components and vice-versa.

Software, in accordance with the invention, such as program code and/or data, may be stored on one or more computer readable mediums. It is also contemplated that software identified herein may be implemented using one or more general purpose or specific purpose computers and/or computer systems, networked and/or otherwise. Where applicable, ordering of various steps described herein may be changed, combined into composite steps, and/or separated into sub-steps to provide features described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore

What is claimed as new and desired to be protected is:

1. An infrared imaging device comprising:
   a substrate having a first metal layer disposed at least partially on a surface of the substrate;
   an infrared detector array coupled to the substrate via a plurality of contacts, wherein each contact comprises:
     a second metal layer;
     a metal stud having a first end and a second end and disposed between the first metal layer and the second metal layer, wherein the first end is disposed on a portion of the first metal layer that is at least partially on the surface of the substrate;
     wherein the second metal layer forms part of a leg metal layer to couple with an infrared detector within the infrared detector array and wherein the second metal layer covers a surface of the second end and wraps around an outer edge of the surface of the second end of the metal stud;
     wherein a portion of the second metal layer that wraps around the outer edge of the second end forms a depression in the second metal layer;
     a third metal layer formed on the second metal layer, wherein the third metal layer at least partially fills the depression in the second metal layer; and
     a first passivation layer formed on the third metal layer.

2. The infrared imaging device of claim 1, wherein a readout integrated circuit is formed within the substrate, and wherein the third metal layer completely fills the depression in the second metal layer.

3. The infrared imaging device of claim 1, wherein the infrared detector array comprises a plurality of microbolometers, and wherein the leg metal layer couples with a corresponding leg of the microbolometer.

4. The infrared imaging device of claim 1, wherein the contact further comprises:
   a second passivation layer formed on the second metal layer on a side opposite of where the third metal layer is formed, wherein the second passivation layer is disposed at a top portion of the contact distant from the first metal layer.

5. The infrared imaging device of claim 4, wherein the first passivation layer is made of silicon dioxide, wherein the second passivation layer is made of silicon nitride, and wherein the metal stud is formed by deposition.

6. The infrared imaging device of claim 5, wherein the second metal layer is formed directly on the first metal layer via the metal stud with no intervening liner layer between the second metal layer and the first metal layer, wherein the first metal layer forms part of the readout integrated circuit within the substrate, wherein the infrared detector array comprises a plurality of microbolometers, and wherein the second metal layer forms part of the leg metal layer to couple with a corresponding leg of the microbolometer.

7. The infrared imaging device of claim 1, wherein the infrared detector array comprises a plurality of microbolometers, and wherein each microbolometer comprises:
   a resistive material forming a bridge; and
   legs coupling the resistive material to the second metal layer, wherein the first metal layer forms part of a readout integrated circuit within the substrate.

8. A method of forming the contact of claim 1 on the substrate for the infrared detector array, the method comprising:
   applying a polyimide coating on the substrate;
   applying a passivation layer on the polyimide coating;
   applying a photoresist pattern on the passivation layer;
   etching to expose the first metal layer on the substrate;
   forming the first end of the metal stud on the first metal layer;
   depositing the second metal layer on the second end of the metal stud so that the second metal layer covers the surface of the second end and wraps around the outer edge of the surface of the second end of the metal stud, wherein the second end is disposed opposite the first end of the metal stud;
   applying a photoresist pattern on the second metal layer;
   depositing the third metal layer on the second metal layer to at least partially fill the depression in the second metal layer;
   applying the first passivation layer on the third metal layer and a portion of the second metal layer; and
   etching to release and provide the contact.

9. The method of claim 8, comprising:
   applying a photoresist pattern to the substrate;
   depositing the first metal layer on the substrate, wherein the first metal layer is coupled to a readout integrated circuit formed within the substrate;
   wherein the second metal layer is deposited directly on the metal stud and there is no intervening liner layer between the metal stud and the first metal layer; and
   wherein the passivation layer is disposed at a top portion of the contact distant from the first metal layer.

10. The method of claim 9, wherein the infrared detector array comprises a plurality of microbolometers, wherein the second metal layer forms part of a leg metal layer to couple with a corresponding leg of the microbolometer, and wherein the metal stud is formed by deposition.

11. The method of claim 8, comprising:
    applying a photoresist pattern on the passivation layer before depositing the second metal layer;
    wherein the depositing the third metal layer comprises lifting-off a portion of the third metal layer and removing the photoresist; and
    wherein the etching to release comprises:
    applying a photoresist pattern over the third metal layer;
    performing ion milling; and
    removing the photoresist pattern remaining.

12. An infrared imaging device comprising:
    a substrate having a first metal layer disposed at least partially on a surface of the substrate;
    an infrared detector array coupled to the substrate via a plurality of contacts, wherein each contact comprises:
      a metal stud having a first end and a second end, wherein the first end is formed on the first metal layer on at least a portion disposed on the surface of the substrate;
      a second metal layer covering a surface of the second end and wrapping around an outer edge of the surface of the second end of the metal stud;
      wherein a portion of the second metal layer that wraps around the outer edge of the second end forms a depression in the second metal layer and
      a third metal layer formed on the second metal layer, wherein the third metal layer at least partially fills the depression in the second metal layer.

13. The infrared imaging device of claim 12, wherein a readout integrated circuit is formed within the substrate, wherein the third metal layer completely fills the depression in the second metal layer, and wherein each contact further comprises: a first passivation layer formed on the third metal layer.

14. The infrared imaging device of claim 13, further comprising a second passivation layer formed on the second metal layer on a side opposite of where the third metal layer is formed, wherein the second passivation layer is disposed at a top portion of the contact distant from the metal stud.

15. The infrared imaging device of claim 14, wherein the first passivation layer is made of silicon dioxide, wherein the second passivation layer is made of silicon nitride, and wherein the contact comprises an etch-stop layer disposed between the metal stud and the second metal layer, with the metal stud formed by deposition.

16. The infrared imaging device of claim 12, wherein the infrared detector array comprises a plurality of microbolometers, and wherein the second metal layer forms part of a leg metal layer to couple with a corresponding leg of the microbolometer.

17. The infrared imaging device of claim 12, wherein the second metal layer is formed directly on the metal stud, and wherein the contact comprises a plating base layer disposed between the metal stud and the first metal layer.

18. The infrared imaging device of claim 12, wherein the infrared detector array comprises a plurality of microbolometers, and wherein each microbolometer comprises:
    a resistive material forming a bridge; and
    legs coupling the resistive material to the second metal layer, wherein the first metal layer forms part of a readout integrated circuit within the substrate.

19. A method of forming the contact of claim 12 on the substrate for the infrared detector array, the method comprising:
    applying a polyimide coating on the substrate;
    applying a photoresist pattern on the polyimide coating;
    etching the polyimide coating to expose the first metal layer on the substrate;
    forming the metal stud on the first metal layer;
    planarizing a surface of the polyimide coating and the metal stud;
    applying a passivation layer on the polyimide coating and the metal stud;
    applying a photoresist pattern on the passivation layer;
    etching to expose the metal stud; and
    depositing the second metal layer on the second end of the metal stud so that the second metal layer covers the surface of the second end and wraps around the outer edge of surface of the second end of the metal stud.

20. The method of claim 19, comprising:
    applying a photoresist pattern to a substrate;
    depositing the first metal layer on the substrate, wherein the first metal layer is coupled to a readout integrated circuit formed within the substrate;
    depositing the third metal layer on the second metal layer;
    applying a first passivation layer on the third metal layer and a portion of the second metal layer;
    etching to release and provide the contact;
    wherein the first passivation layer is disposed at a top portion of the contact distant from the metal stud; and
    wherein the etching the polyimide coating and the etching to expose the metal stud comprises subsequently removing the photoresist pattern remaining.

21. The method of claim 19, wherein the infrared detector array comprises a plurality of microbolometers, and wherein the second metal layer forms part of a leg metal layer to couple with a corresponding leg of the microbolometer.

22. The method of claim 21, wherein the infrared detector array comprises a plurality of microbolometers, and wherein the passivation layer, the first passivation layer, and the second metal layer portions released from the contact form part of a bridge of at least one of the microbolometers.

23. The method of claim 19, wherein the forming the metal stud comprises depositing a metal to form the metal stud.

24. The method of claim 19, wherein the forming the metal stud comprises:
    depositing a plating base on the polyimide coating and the first metal layer;
    performing an electroplating process to form the metal stud over the first metal layer, wherein the plating base is disposed between the metal stud and the first metal layer;
    etching the plating base; and
    reapplying the polyimide coating and applying a lap-stop material on the polyimide coating prior to the planarizing of the surface which removes the lap-stop material.

25. The method of claim 24, comprising:
    applying a lap-stop material on the metal stud prior to the etching of the plating base; and
    depositing an etch-stop layer on the metal stud prior to depositing the second metal layer.

* * * * *